(12) United States Patent
Higashino

(10) Patent No.: US 6,363,122 B1
(45) Date of Patent: Mar. 26, 2002

(54) CODING APPARATUS AND DECODING APPARATUS

(75) Inventor: Satoru Higashino, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/165,193

(22) Filed: Oct. 2, 1998

(30) Foreign Application Priority Data

Oct. 3, 1997 (JP) .............................................. 9-271796

(51) Int. Cl.⁷ ...................... H03M 13/03; H03M 13/12; G11B 20/14; G11B 20/18; H04L 25/497
(52) U.S. Cl. ......................... 375/265; 375/262; 360/41; 714/792
(58) Field of Search .................................. 375/265, 262, 375/341; 360/71, 77.08, 41, 40; 714/792, 794, 795, 809; 369/59

(56) References Cited

U.S. PATENT DOCUMENTS

| | | | |
|---|---|---|---|
| 5,786,950 A | * 7/1998 | Zook et al. .................... 360/41 |
| 5,802,118 A | * 9/1998 | Bliss et al. .................. 375/350 |
| 5,961,658 A | * 10/1999 | Reed et al. .................. 714/746 |
| 5,966,415 A | * 10/1999 | Bliss et al. .................. 375/350 |
| 6,032,284 A | * 2/2000 | Bliss ............................ 714/792 |
| 6,052,248 A | * 4/2000 | Reed et al. .................... 360/53 |
| 6,154,504 A | * 11/2000 | Ino ............................. 375/265 |
| 6,201,779 B1 | * 3/2001 | Reed ............................. 369/59 |
| 6,212,661 B1 | * 4/2001 | Rub et al. .................... 714/769 |

OTHER PUBLICATIONS

Alini R. et al., "A 200–MSample/s Trellis–Coded PRML Read/Writer Channel with Analog Adaptive Equalizer and Digital Servo", IEEE Journal of Solid–State Circuits, vol. 32, No. 11, pp. 1824–1838, Nov. 1997.*

She S. et al., "Performance of a 8/9 Rate Matched Spectrum Null Code on the PR4 Magnetic Recording Channel", IEEE Transactions on Magnetics, vol. 34, No. 4, pp. 1943–1945, Jul. 1998.*

William G. Bliss, "An 8/9 Rate Time–Varying Trellis Code for High Density Magnetic Recording", IEEE Transactions on Magnetics, vol. 33, No. 5, pp. 2746–2748, Mar. 1995.*

Fredrickson L. et al., "Improved Trellis–Coding for Partial–Response Channels", IEEE Transactions on Magnetics, vol. 31, No. 2, pp. 1141–1148, Mar. 1995.*

* cited by examiner

Primary Examiner—Chi Pham
Assistant Examiner—Dung X. Nguyen
(74) Attorney, Agent, or Firm—Sonnenschein, Nath & Rosenthal

(57) ABSTRACT

In order to implement encoding which is proof against noise and distortion, there is provided an encoder for coding a train of input codes characterized in that 3 consecutively transiting consistent codes starting from either an odd-numbered or an even-numbered channel clock pulse of a channel clock signal and all 4 consecutively transiting consistent codes are restricted to produce a train of output codes and the number of produced codes in the train is made even.

11 Claims, 29 Drawing Sheets

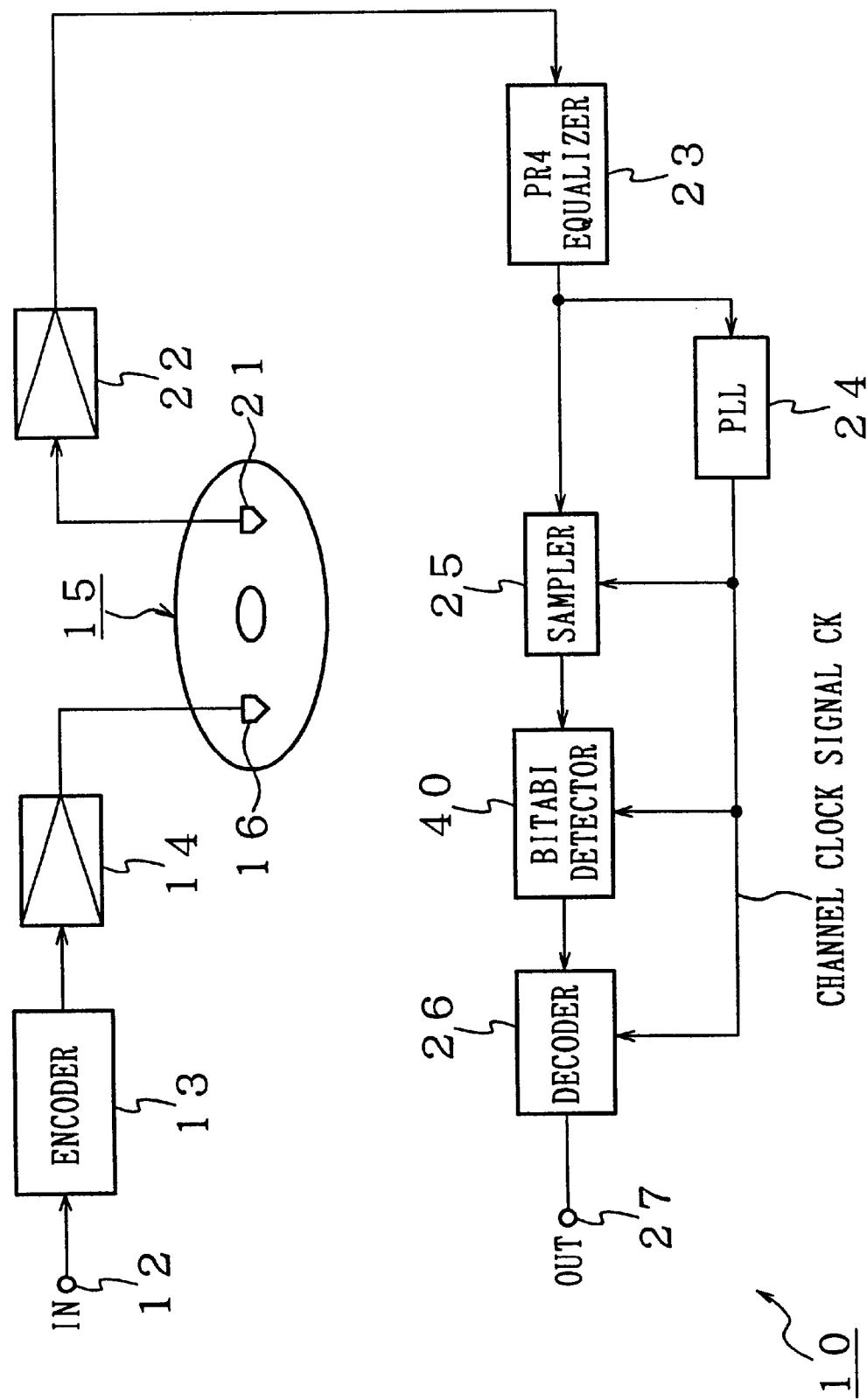

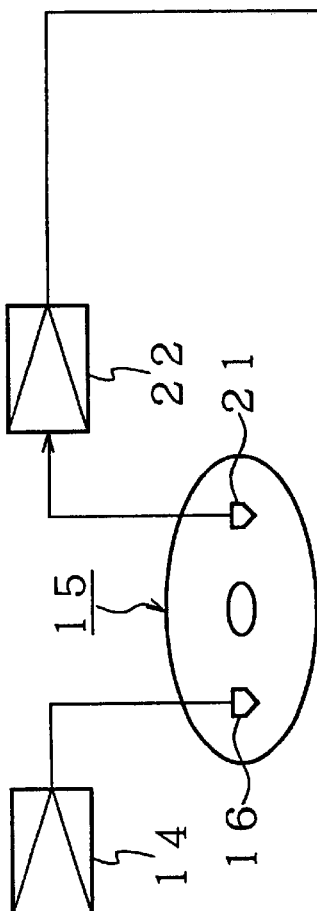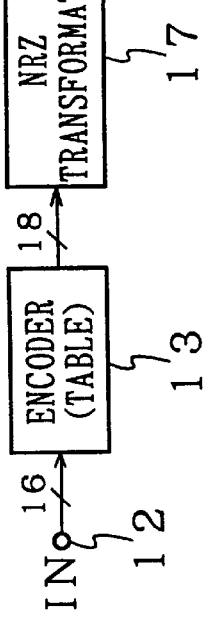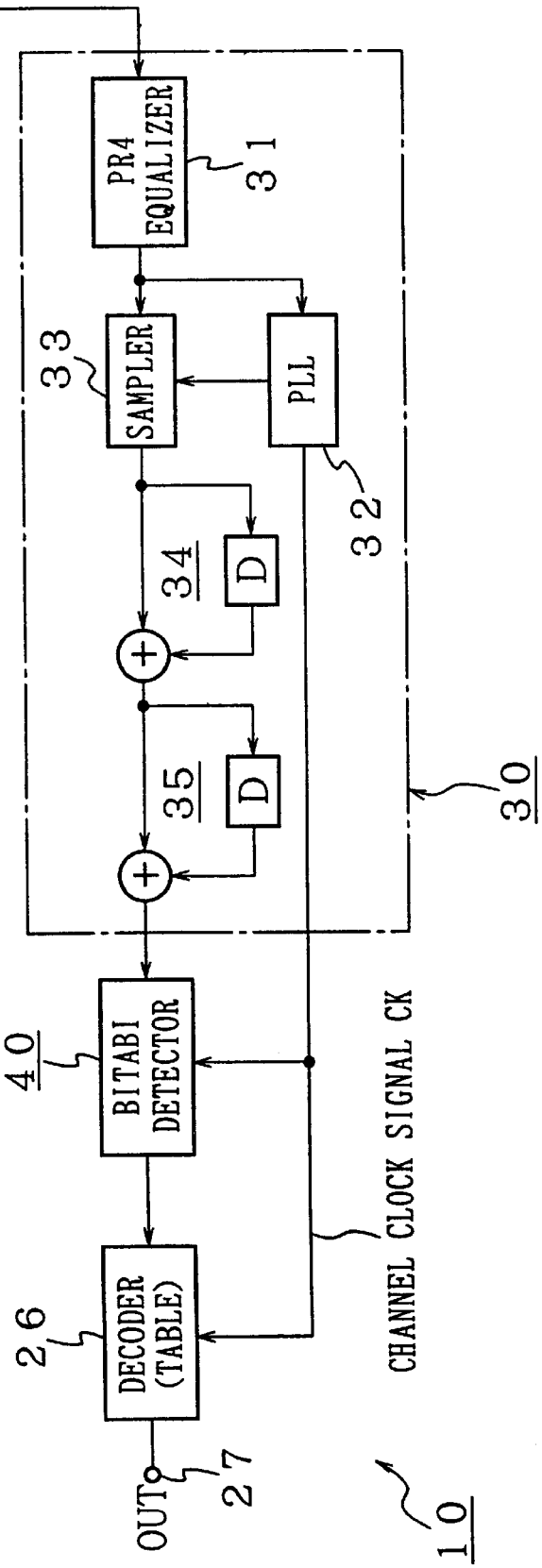
FIG. 2 PRIOR ART

FIG. 5

1ST SQUARED MINIMUM:6(32)

| | | | |
|---|---|---|---|
| si=0 sm=12<br>seq0: 0101100<br>seq1: 1011100 | si=4 sm=12<br>seq0: 0101100<br>seq1: 1011100 | si=8 sm=12<br>seq0: 0101100<br>seq1: 1011100 | si=12 sm=12<br>seq0: 0101100<br>seq1: 1011100 |
| si=0 sm=13<br>seq0: 0101101<br>seq1: 1011101 | si=4 sm=13<br>seq0: 0101101<br>seq1: 1011101 | si=8 sm=13<br>seq0: 0101101<br>seq1: 1011101 | si=12 sm=13<br>seq0: 0101101<br>seq1: 1011101 |
| si=0 sm=14<br>seq0: 0101110<br>seq1: 1011110 | si=4 sm=14<br>seq0: 0101110<br>seq1: 1011110 | si=8 sm=14<br>seq0: 0101110<br>seq1: 1011110 | si=12 sm=14<br>seq0: 0101110<br>seq1: 1011110 |
| si=0 sm=15<br>seq0: 0101111<br>seq1: 1011111 | si=4 sm=15<br>seq0: 0101111<br>seq1: 1011111 | si=8 sm=15<br>seq0: 0101111<br>seq1: 1011111 | si=12 sm=15<br>seq0: 0101111<br>seq1: 1011111 |
| si=3 sm=0<br>seq0: 0100000<br>seq1: 1010000 | si=7 sm=0<br>seq0: 0100000<br>seq1: 1010000 | si=11 sm=0<br>seq0: 0100000<br>seq1: 1010000 | si=15 sm=0<br>seq0: 0100000<br>seq1: 1010000 |
| si=3 sm=1<br>seq0: 0100001<br>seq1: 1010001 | si=7 sm=1<br>seq0: 0100001<br>seq1: 1010001 | si=11 sm=1<br>seq0: 0100001<br>seq1: 1010001 | si=15 sm=1<br>seq0: 0100001<br>seq1: 1010001 |
| si=3 sm=2<br>seq0: 0100010<br>seq1: 1010010 | si=7 sm=2<br>seq0: 0100010<br>seq1: 1010010 | si=11 sm=2<br>seq0: 0100010<br>seq1: 1010010 | si=15 sm=2<br>seq0: 0100010<br>seq1: 1010010 |
| si=3 sm=3<br>seq0: 0100011<br>seq1: 1010011 | si=7 sm=3<br>seq0: 0100011<br>seq1: 1010011 | si=11 sm=3<br>seq0: 0100011<br>seq1: 1010011 | si=15 sm=3<br>seq0: 0100011<br>seq1: 1010011 |

FIG. 6

2ND SQUARED MINIMUM:8(32)

si=0  sm=0
seq0: 010110100000
seq1: 101111010000 si=0  sm=1
seq0: 010110100001
seq1: 101111010001 si=0  sm=2
seq0: 010110100010
seq1: 101111010010 si=0  sm=3
seq0: 010110100011
seq1: 101111010011 si=3  sm=12
seq0: 010000101100
seq1: 101001011100 si=3  sm=13
seq0: 010000101101
seq1: 101001011101 si=3  sm=14
seq0: 010000101110
seq1: 101001011110 si=3  sm=15
seq0: 010000101111
seq1: 101001011111 si=4  sm=0
seq0: 010110100000
seq1: 101111010000 si=4  sm=1
seq0: 010110100001
seq1: 101111010001 si=4  sm=2
seq0: 010110100010
seq1: 101111010010 si=4  sm=3
seq0: 010110100011
seq1: 101111010011 si=7  sm=12
seq0: 010000101100
seq1: 101001011100 si=7  sm=13
seq0: 010000101101
seq1: 101001011101 si=7  sm=14
seq0: 010000101110
seq1: 101001011110 si=7  sm=15
seq0: 010000101111
seq1: 101001011111 si=8  sm=0
seq0: 010110100000
seq1: 101111010000 si=8  sm=1
seq0: 010110100001
seq1: 101111010001 si=8  sm=2
seq0: 010110100010
seq1: 101111010010 si=8  sm=3
seq0: 010110100011
seq1: 101111010011 si=11 sm=12
seq0: 010000101100
seq1: 101001011100 si=11 sm=13
seq0: 010000101101
seq1: 101001011101 si=11 sm=14
seq0: 010000101110
seq1: 101001011110 si=11 sm=15
seq0: 010000101111
seq1: 101001011111 si=12 sm=0
seq0: 010110100000
seq1: 101111010000 si=12 sm=1
seq0: 010110100001
seq1: 101111010001 si=12 sm=2
seq0: 010110100010
seq1: 101111010010 si=12 sm=3
seq0: 010110100011
seq1: 101111010011 si=15 sm=12
seq0: 010000101100
seq1: 101001011100 si=15 sm=13
seq0: 010000101101
seq1: 101001011101 si=15 sm=14
seq0: 010000101110
seq1: 101001011110 si=15 sm=15
seq0: 010000101111
seq1: 101001011111

FIG. 8

| m/n | CODING RATE | TOTAL NUMBER OF CODES | k RESTRICTION (NUMBER OF CODES) |
|---|---|---|---|
| 5/6 | 0.833 | 38 | 6(33) |
| 10/12 | 0.833 | 1762 | 4(1054) |
| 12/14 | 0.857 | 6278 | 5(4375) |
| 14/16 | 0.875 | 22362 | 6(17641) |
| 16/18 | 0.8889 | 79646 | 7(67743) |
| 18/20 | 0.9 | 283666 | 10(268578) |

FIG. 9
(PRIOR ART)

| m/n | CODING RATE | TOTAL NUMBER OF CODES | k RESTRICTION (NUMBER OF CODES) |
|---|---|---|---|
| 5/6 | 0.833 | 38 | 6(33) |
| 10/12 | 0.833 | 1667 | 5(1178) |
| 13/15 | 0.8667 | 10910 | 6(8593) |
| 16/18 | 0.8889 | 71372 | 9(65742) |

FIG. 10

| DECIMAL:16 BITS | 18 BITS |
|---|---|
| 0 | 110010001000110000 |
| 1 | 001010001000110000 |
| 2 | 101010001000110000 |
| 3 | 011010001000110000 |
| 4 | 000110001000110000 |
| 5 | 100110001000110000 |
| 6 | 010110001000110000 |
| 7 | 110110001000110000 |
| 8 | 100001001000110000 |
| 9 | 010001001000110000 |
| 10 | 110001001000110000 |
| 65526 | 001001110111011101 |
| 65527 | 101001110111011101 |
| 65528 | 011001110111011101 |
| 65529 | 000101110111011101 |
| 65530 | 100101110111011101 |
| 65531 | 010101110111011101 |
| 65532 | 110101110111011101 |
| 65533 | 001101110111011101 |
| 65534 | 101101110111011101 |
| 65535 | 011101110111011101 |

FIG. 11

| DECIMAL: 16 BITS | 18 BITS |
|---|---|
| 0 | 101010110010101000 |
| 1 | 011010110010101000 |
| 2 | 000110110010101000 |
| 3 | 100110110010101000 |
| 4 | 010110110010101000 |
| 5 | 001110110010101000 |
| 6 | 101110110010101000 |
| 7 | 100000001010101000 |
| 8 | 010000001010101000 |
| 9 | 001000001010101000 |
| 10 | 101000001010101000 |
| 65526 | 100101101110111011 |
| 65527 | 010101101110111011 |
| 65528 | 001101101110111011 |
| 65529 | 101101101110111011 |
| 65530 | 000011101110111011 |
| 65531 | 100011101110111011 |
| 65532 | 010011101110111011 |
| 65533 | 001011101110111011 |
| 65534 | 101011101110111011 |
| 65535 | 011011101110111011 |

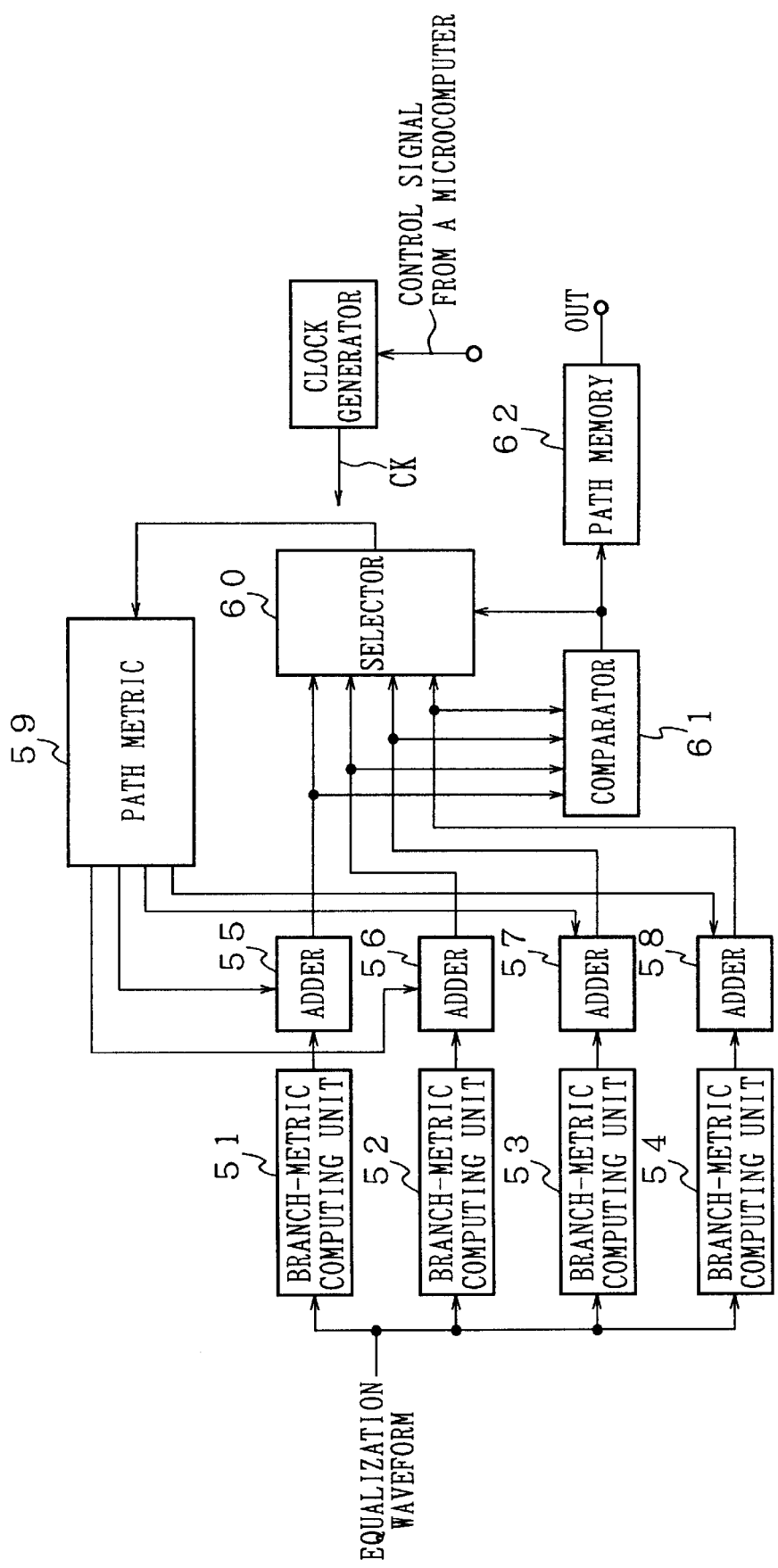
F I G. 15

F I G. 1 7
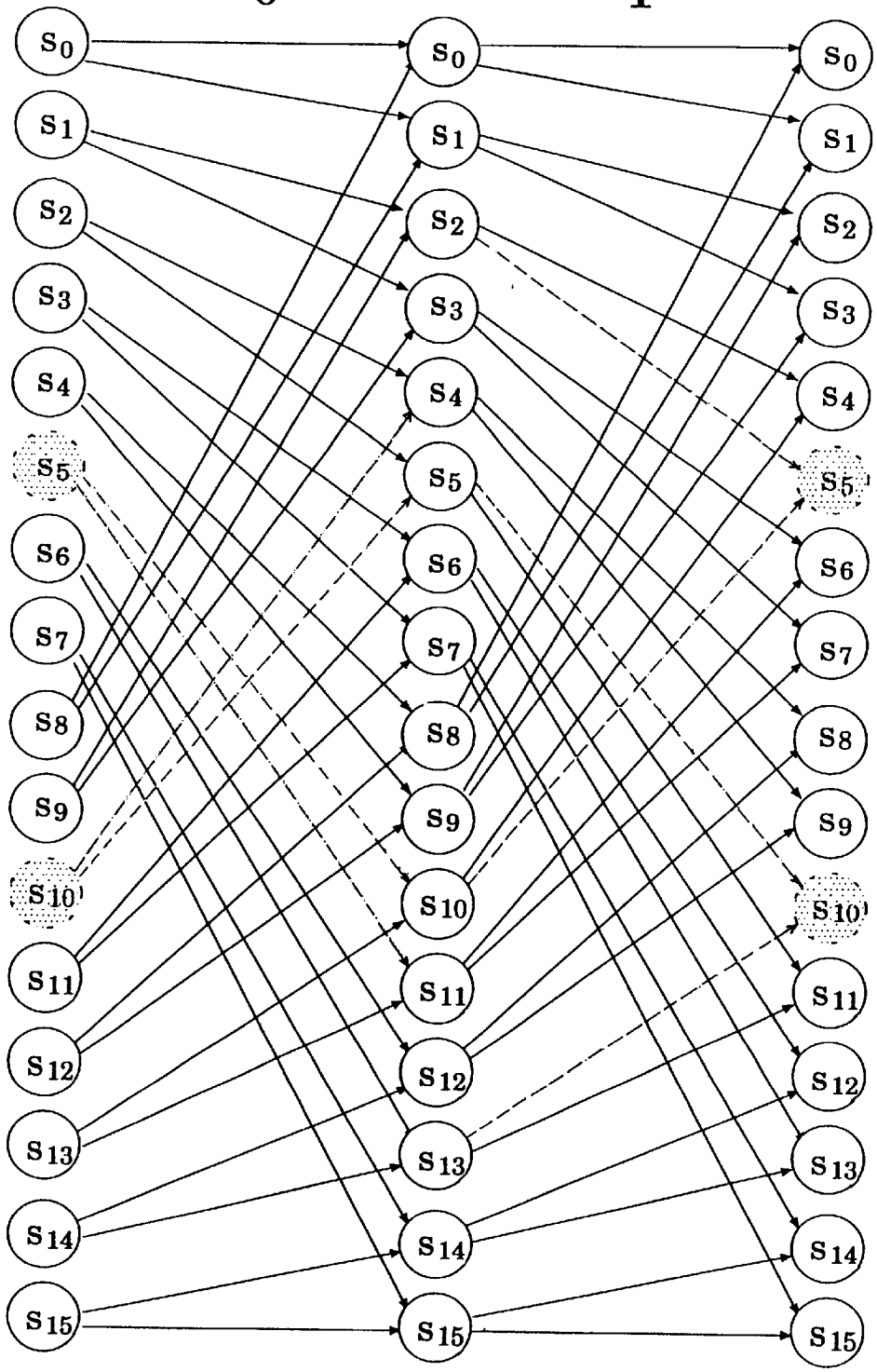

FIG. 20

| | | | | | | | |
|---|---|---|---|---|---|---|---|
| 0 | 001000000 | 64 | 011001100 | 128 | 011010110 | 192 | 010100101 |
| 1 | 101000000 | 65 | 000101100 | 129 | 000110110 | 193 | 001100101 |
| 2 | 011000000 | 66 | 100101100 | 130 | 100110110 | 194 | 101100101 |
| 3 | 000100000 | 67 | 010101100 | 131 | 010110110 | 195 | 011100101 |
| 4 | 100100000 | 68 | 001101100 | 132 | 000001110 | 196 | 000010101 |
| 5 | 010100000 | 69 | 101101100 | 133 | 100001110 | 197 | 100010101 |
| 6 | 001100000 | 70 | 011101100 | 134 | 010001110 | 198 | 010010101 |
| 7 | 101100000 | 71 | 100000010 | 135 | 001001110 | 199 | 001010101 |
| 8 | 011100000 | 72 | 010000010 | 136 | 101001110 | 200 | 101010101 |
| 9 | 000010000 | 73 | 001000010 | 137 | 011001110 | 201 | 011010101 |
| 10 | 100010000 | 74 | 101000010 | 138 | 000101110 | 202 | 000110101 |
| 11 | 010010000 | 75 | 011000010 | 139 | 100101110 | 203 | 100110101 |
| 12 | 001010000 | 76 | 000100010 | 140 | 010101110 | 204 | 010110101 |
| 13 | 101010000 | 77 | 100100010 | 141 | 001101110 | 205 | 000001101 |
| 14 | 011010000 | 78 | 010100010 | 142 | 101101110 | 206 | 100001101 |
| 15 | 000110000 | 79 | 001100010 | 143 | 011101110 | 207 | 010001101 |
| 16 | 100110000 | 80 | 101100010 | 144 | 100000001 | 208 | 001001101 |
| 17 | 010110000 | 81 | 011100010 | 145 | 010000001 | 209 | 101001101 |
| 18 | 000001000 | 82 | 000010010 | 146 | 001000001 | 210 | 011001101 |
| 19 | 100001000 | 83 | 100010010 | 147 | 101000001 | 211 | 000101101 |
| 20 | 010001000 | 84 | 010010010 | 148 | 011000001 | 212 | 100101101 |
| 21 | 001001000 | 85 | 001010010 | 149 | 000100001 | 213 | 010101101 |
| 22 | 101001000 | 86 | 101010010 | 150 | 100100001 | 214 | 001101101 |
| 23 | 011001000 | 87 | 011010010 | 151 | 010100001 | 215 | 101101101 |
| 24 | 000101000 | 88 | 000110010 | 152 | 001100001 | 216 | 011101101 |
| 25 | 100101000 | 89 | 100110010 | 153 | 101100001 | 217 | 100000011 |
| 26 | 010101000 | 90 | 010110010 | 154 | 011100001 | 218 | 010000011 |
| 27 | 001101000 | 91 | 000001010 | 155 | 000010001 | 219 | 001000011 |
| 28 | 101101000 | 92 | 100001010 | 156 | 100010001 | 220 | 101000011 |
| 29 | 011101000 | 93 | 010001010 | 157 | 010010001 | 221 | 011000011 |
| 30 | 000011000 | 94 | 001001010 | 158 | 001010001 | 222 | 000100011 |
| 31 | 100011000 | 95 | 101001010 | 159 | 101010001 | 223 | 100100011 |

FIG. 21

| | | | | | | | |
|---|---|---|---|---|---|---|---|
| 32 | 010011000 | 96 | 011001010 | 160 | 011010001 | 224 | 010100011 |
| 33 | 001011000 | 97 | 000101010 | 161 | 000110001 | 225 | 001100011 |
| 34 | 101011000 | 98 | 100101010 | 162 | 100110001 | 226 | 101100011 |
| 35 | 011011000 | 99 | 010101010 | 163 | 010110001 | 227 | 011100011 |
| 36 | 000111000 | 100 | 001101010 | 164 | 000001001 | 228 | 000010011 |
| 37 | 100111000 | 101 | 101101010 | 165 | 100001001 | 229 | 100010011 |
| 38 | 010111000 | 102 | 011101010 | 166 | 010001001 | 230 | 010010011 |
| 39 | 100000100 | 103 | 000011010 | 167 | 001001001 | 231 | 001010011 |
| 40 | 010000100 | 104 | 100011010 | 168 | 101001001 | 232 | 101010011 |
| 41 | 001000100 | 105 | 010011010 | 169 | 011001001 | 233 | 011010011 |
| 42 | 101000100 | 106 | 001011010 | 170 | 000101001 | 234 | 000110011 |
| 43 | 011000100 | 107 | 101011010 | 171 | 100101001 | 235 | 100110011 |
| 44 | 000100100 | 108 | 011011010 | 172 | 010101001 | 236 | 010110011 |
| 45 | 100100100 | 109 | 000111010 | 173 | 001101001 | 237 | 000001011 |
| 46 | 010100100 | 110 | 100111010 | 174 | 101101001 | 238 | 100001011 |
| 47 | 001100100 | 111 | 010111010 | 175 | 011101001 | 239 | 010001011 |
| 48 | 101100100 | 112 | 100000110 | 176 | 000011001 | 240 | 001001011 |
| 49 | 011100100 | 113 | 010000110 | 177 | 100011001 | 241 | 101001011 |
| 50 | 000010100 | 114 | 001000110 | 178 | 010011001 | 242 | 011001011 |
| 51 | 100010100 | 115 | 101000110 | 179 | 001011001 | 243 | 000101011 |
| 52 | 010010100 | 116 | 011000110 | 180 | 101011001 | 244 | 100101011 |
| 53 | 001010100 | 117 | 000100110 | 181 | 011011001 | 245 | 010101011 |
| 54 | 101010100 | 118 | 100100110 | 182 | 000111001 | 246 | 001101011 |
| 55 | 011010100 | 119 | 010100110 | 183 | 100111001 | 247 | 101101011 |
| 56 | 000110100 | 120 | 001100110 | 184 | 010111001 | 248 | 011101011 |
| 57 | 100110100 | 121 | 101100110 | 185 | 100000101 | 249 | 000011011 |
| 58 | 010110100 | 122 | 011100110 | 186 | 010000101 | 250 | 100011011 |
| 59 | 000001100 | 123 | 000010110 | 187 | 001000101 | 251 | 010011011 |
| 60 | 100001100 | 124 | 100010110 | 188 | 101000101 | 252 | 001011011 |
| 61 | 010001100 | 125 | 010010110 | 189 | 011000101 | 253 | 101011011 |
| 62 | 001001100 | 126 | 001010110 | 190 | 000100101 | 254 | 011011011 |
| 63 | 101001100 | 127 | 101010110 | 191 | 100100101 | 255 | 000111011 |

FIG. 24

1ST SQUARED MINIMUM:12(128)

| si=0  sm=24 | si=8  sm=24 | si=16 sm=24 | si=24 sm=24 |
|---|---|---|---|
| seq0: 01011000 | seq0: 01011000 | seq0: 01011000 | seq0: 01011000 |
| seq1: 10111000 | seq1: 10111000 | seq1: 10111000 | seq1: 10111000 |

| si=0  sm=25 | si=8  sm=25 | si=16 sm=25 | si=24 sm=25 |
|---|---|---|---|
| seq0: 01011001 | seq0: 01011001 | seq0: 01011001 | seq0: 01011001 |
| seq1: 10111001 | seq1: 10111001 | seq1: 10111001 | seq1: 10111001 |

| si=0  sm=26 | si=8  sm=26 | si=16 sm=26 | si=24 sm=26 |
|---|---|---|---|
| seq0: 01011010 | seq0: 01011010 | seq0: 01011010 | seq0: 01011010 |
| seq1: 10111010 | seq1: 10111010 | seq1: 10111010 | seq1: 10111010 |

| si=0  sm=27 | si=8  sm=27 | si=16 sm=27 | si=24 sm=27 |
|---|---|---|---|
| seq0: 01011011 | seq0: 01011011 | seq0: 01011011 | seq0: 01011011 |
| seq1: 10111011 | seq1: 10111011 | seq1: 10111011 | seq1: 10111011 |

| si=0  sm=28 | si=8  sm=28 | si=16 sm=28 | si=24 sm=28 |
|---|---|---|---|
| seq0: 01011100 | seq0: 01011100 | seq0: 01011100 | seq0: 01011100 |
| seq1: 10111100 | seq1: 10111100 | seq1: 10111100 | seq1: 10111100 |

| si=0 sm=29 | si=8 sm=29 | si=16 sm=29 | si=24 sm=29 |
|---|---|---|---|
| seq0: 01011101 | seq0: 01011101 | seq0: 01011101 | seq0: 01011101 |
| seq1: 10111101 | seq1: 10111101 | seq1: 10111101 | seq1: 10111101 |

| si=0  sm=30 | si=8  sm=30 | si=16 sm=30 | si=24 sm=30 |
|---|---|---|---|
| seq0: 01011110 | seq0: 01011110 | seq0: 01011110 | seq0: 01011110 |
| seq1: 10111110 | seq1: 10111110 | seq1: 10111110 | seq1: 10111110 |

| si=0  sm=31 | si=8  sm=31 | si=16 sm=31 | si=24 sm=31 |
|---|---|---|---|
| seq0: 01011111 | seq0: 01011111 | seq0: 01011111 | seq0: 01011111 |
| seq1: 10111111 | seq1: 10111111 | seq1: 10111111 | seq1: 10111111 |

FIG. 25

| | | | |
|---|---|---|---|
| si=3 sm=0 | si=11 sm=0 | si=19 sm=0 | si=27 sm=0 |
| seq0: 01000000 | seq0: 01000000 | seq0: 01000000 | seq0: 01000000 |
| seq1: 10100000 | seq1: 10100000 | seq1: 10100000 | seq1: 10100000 |
| | | | |
| si=3 sm=1 | si=11 sm=1 | si=19 sm=1 | si=27 sm=1 |
| seq0: 01000001 | seq0: 01000001 | seq0: 01000001 | seq0: 01000001 |
| seq1: 10100001 | seq1: 10100001 | seq1: 10100001 | seq1: 10100001 |
| | | | |
| si=3 sm=2 | si=11 sm=2 | si=19 sm=2 | si=27 sm=2 |
| seq0: 01000010 | seq0: 01000010 | seq0: 01000010 | seq0: 01000010 |
| seq1: 10100010 | seq1: 10100010 | seq1: 10100010 | seq1: 10100010 |
| | | | |
| si=3 sm=3 | si=11 sm=3 | si=19 sm=3 | si=27 sm=3 |
| seq0: 01000011 | seq0: 01000011 | seq0: 01000011 | seq0: 01000011 |
| seq1: 10100011 | seq1: 10100011 | seq1: 10100011 | seq1: 10100011 |
| | | | |
| si=3 sm=4 | si=11 sm=4 | si=19 sm=4 | si=27 sm=4 |
| seq0: 01000100 | seq0: 01000100 | seq0: 01000100 | seq0: 01000100 |
| seq1: 10100100 | seq1: 10100100 | seq1: 10100100 | seq1: 10100100 |
| | | | |
| si=3 sm=5 | si=11 sm=5 | si=19 sm=5 | si=27 sm=5 |
| seq0: 01000101 | seq0: 01000101 | seq0: 01000101 | seq0: 01000101 |
| seq1: 10100101 | seq1: 10100101 | seq1: 10100101 | seq1: 10100101 |
| | | | |
| si=3 sm=6 | si=11 sm=6 | si=19 sm=6 | si=27 sm=6 |
| seq0: 01000110 | seq0: 01000110 | seq0: 01000110 | seq0: 01000110 |
| seq1: 10100110 | seq1: 10100110 | seq1: 10100110 | seq1: 10100110 |
| | | | |
| si=3 sm=7 | si=11 sm=7 | si=19 sm=7 | si=27 sm=7 |
| seq0: 01000111 | seq0: 01000111 | seq0: 01000111 | seq0: 01000111 |
| seq1: 10100111 | seq1: 10100111 | seq1: 10100111 | seq1: 10100111 |
| | | | |
| si=4 sm=24 | si=12 sm=24 | si=20 sm=24 | si=28 sm=24 |
| seq0: 01011000 | seq0: 01011000 | seq0: 01011000 | seq0: 01011000 |
| seq1: 10111000 | seq1: 10111000 | seq1: 10111000 | seq1: 10111000 |

FIG. 26

| | | | |
|---|---|---|---|
| si=4 sm=25 | si=12 sm=25 | si=20 sm=25 | si=28 sm=25 |
| seq0: 01011001 | seq0: 01011001 | seq0: 01011001 | seq0: 01011001 |
| seq1: 10111001 | seq1: 10111001 | seq1: 10111001 | seq1: 10111001 |
| | | | |
| si=4 sm=26 | si=12 sm=26 | si=20 sm=26 | si=28 sm=26 |
| seq0: 01011010 | seq0: 01011010 | seq0: 01011010 | seq0: 01011010 |
| seq1: 10111010 | seq1: 10111010 | seq1: 10111010 | seq1: 10111010 |
| | | | |
| si=4 sm=27 | si=12 sm=27 | si=20 sm=27 | si=28 sm=27 |
| seq0: 01011011 | seq0: 01011011 | seq0: 01011011 | seq0: 01011011 |
| seq1: 10111011 | seq1: 10111011 | seq1: 10111011 | seq1: 10111011 |
| | | | |
| si=4 sm=28 | si=12 sm=28 | si=20 sm=28 | si=28 sm=28 |
| seq0: 01011100 | seq0: 01011100 | seq0: 01011100 | seq0: 01011100 |
| seq1: 10111100 | seq1: 10111100 | seq1: 10111100 | seq1: 10111100 |
| | | | |
| si=4 sm=29 | si=12 sm=29 | si=20 sm=29 | si=28 sm=29 |
| seq0: 01011101 | seq0: 01011101 | seq0: 01011101 | seq0: 01011101 |
| seq1: 10111101 | seq1: 10111101 | seq1: 10111101 | seq1: 10111101 |
| | | | |
| si=4 sm=30 | si=12 sm=30 | si=20 sm=30 | si=28 sm=30 |
| seq0: 01011110 | seq0: 01011110 | seq0: 01011110 | seq0: 01011110 |
| seq1: 10111110 | seq1: 10111110 | seq1: 10111110 | seq1: 10111110 |
| | | | |
| si=4 sm=31 | si=12 sm=31 | si=20 sm=31 | si=28 sm=31 |
| seq0: 01011111 | seq0: 01011111 | seq0: 01011111 | seq0: 01011111 |
| seq1: 10111111 | seq1: 10111111 | seq1: 10111111 | seq1: 10111111 |
| | | | |
| si=7 sm=0 | si=15 sm=0 | si=23 sm=0 | si=31 sm=0 |
| seq0: 01000000 | seq0: 01000000 | seq0: 01000000 | seq0: 01000000 |
| seq1: 10100000 | seq1: 10100000 | seq1: 10100000 | seq1: 10100000 |

FIG. 27

| | | | |
|---|---|---|---|
| si=7 sm=1 | si=15 sm=1 | si=23 sm=1 | si=31 sm=1 |
| seq0: 01000001 | seq0: 01000001 | seq0: 01000001 | seq0: 01000001 |
| seq1: 10100001 | seq1: 10100001 | seq1: 10100001 | seq1: 10100001 |
| | | | |
| si=7 sm=2 | si=15 sm=2 | si=23 sm=2 | si=31 sm=2 |
| seq0: 01000010 | seq0: 01000010 | seq0: 01000010 | seq0: 01000010 |
| seq1: 10100010 | seq1: 10100010 | seq1: 10100010 | seq1: 10100010 |
| | | | |
| si=7 sm=3 | si=15 sm=3 | si=23 sm=3 | si=31 sm=3 |
| seq0: 01000011 | seq0: 01000011 | seq0: 01000011 | seq0: 01000011 |
| seq1: 10100011 | seq1: 10100011 | seq1: 10100011 | seq1: 10100011 |
| | | | |
| si=7 sm=4 | si=15 sm=4 | si=23 sm=4 | si=31 sm=4 |
| seq0: 01000100 | seq0: 01000100 | seq0: 01000100 | seq0: 01000100 |
| seq1: 10100100 | seq1: 10100100 | seq1: 10100100 | seq1: 10100100 |
| | | | |
| si=7 sm=5 | si=15 sm=5 | si=23 sm=5 | si=31 sm=5 |
| seq0: 01000101 | seq0: 01000101 | seq0: 01000101 | seq0: 01000101 |
| seq1: 10100101 | seq1: 10100101 | seq1: 10100101 | seq1: 10100101 |
| | | | |
| si=7 sm=6 | si=15 sm=6 | si=23 sm=6 | si=31 sm=6 |
| seq0: 01000110 | seq0: 01000110 | seq0: 01000110 | seq0: 01000110 |
| seq1: 10100110 | seq1: 10100110 | seq1: 10100110 | seq1: 10100110 |
| | | | |
| si=7 sm=7 | si=15 sm=7 | si=23 sm=7 | si=31 sm=7 |
| seq0: 01000111 | seq0: 01000111 | seq0: 01000111 | seq0: 01000111 |
| seq1: 10100111 | seq1: 10100111 | seq1: 10100111 | seq1: 10100111 |

CODING APPARATUS AND DECODING APPARATUS

BACKGROUND OF THE INVENTION

1. Field of the Invention

In general, the present invention relates to a coding apparatus and a decoding apparatus. More particularly, the present invention relates to a coding apparatus and a decoding apparatus wherein equalization suitable for a transmission line such as partial-response equalization is implemented, and in an operation to decode (detect) a train of codes by combining the equalization with maximum-likelihood decoding, coding is carried out by using only codes that increase a minimum intercode distance and decoding serving as a counterpart process of the coding is performed to construct a noise-proof and distortion-proof transmission system so that the size of the circuit can also be shrunk as well.

2. Description of the Prior Art

There are some digital communication apparatuses and some digital recording apparatuses wherein equalization suitable for a transmission line such as partial-response (PR) equalization is carried out and, by combining the equalization with maximum-likelihood decoding, data is detected.

In a transmission system such as one adopting a PRML (Partial Response Maximum-likelihood), for example, equalization is carried out to make a sampling waveform become convolution of codes and the codes are detected by adopting the maximum-likelihood decoding method so as to implement noise-proof and distortion-proof detection of data.

Such a data detection method has been proposed by Roy D. Cideciyan et al. as described in a document like 'A PRML System for Digital Magnetic Recording,' IEEE Journal on selected areas in communications, Vol. 10, No. 1, January 1992. In this data detection method, partial-response 4 (PR4) equalization and a maximum-likelihood decoding technique are adopted.

A digital magnetic disc recording/reproducing apparatus 10 adopting this data detection method is shown in FIG. 1. In the digital magnetic disc recording/reproducing apparatus 10 shown in the figure, data to be recorded coming from an input terminal 12 (typically, 16-bit data) is converted into 18-bit data by an encoder 13. A train of codes output by the encoder 13 with a converted bit rate is supplied to a recording head 16 by way of an amplifier 14 to be recorded into a recording medium 15. As the recording medium 15, a magnetic disc or the like can be used.

On the other hand, a train of codes played back from the recording medium 15 by a reproducing head 21 is supplied to an equalizer 23 by way of an amplifier 22. In the equalizer 23, the train of codes is subjected to partial-response equalization such as PR4 equalization. Then, an output waveform completing the PR4 equalization is supplied to a PLL circuit 24. In the PLL circuit 24, a channel clock signal CK is extracted from the output waveform and supplied to a sampler (sampling circuit) 25 for sampling the waveform completing the equalization.

A signal output by the sampler 25 is supplied to a Bitabi detector 40 to be subjected to maximum-likelihood decoding. Codes completing the maximum-likelihood decoding are then supplied to a decoder 26 for performing decoding, that is, reversed processing of the encoder 13. The decoder 26 decodes the codes to produce back the input data train which is finally output to an output terminal 27.

In such a data transmission system, as a technique of carrying out noise-proof and distortion proof detection of data, there has been proposed a method whereby partial-response equalization is further carried out as it is, and before the data is recorded, data modulation known as MTR (Maximum Transition Run) coding is performed. The MTR coding is also referred to hereafter as Trellis coding.

By adopting this technique, an intercode distance (Euclid distance) can be increased, allowing noise-proof and distortion-proof detection to be carried out. As Trellis coding, MSN (Matched Spectral Null) Trellis coding using MSN codes and time-varying Trellis coding are known.

The MSN Trellis coding was proposed by L. Fredrickson et al. as described in a document such as 'Improved Trellis Coding for Partial-response Channels,' IEEE Transaction on Magnetics, Vol. 31, No. 2, March 1995.

The time-varying Trellis coding was proposed by William G. Bliss as described in a document with a title of 'An 8/9 Rate Time-varying Trellis Code for High Density Magnetic Recording,' IEEE 1997 Digest of Intermag '97.

By the way, the MSN Trellis coding described above and the method of detection thereof have a problem that, in order to provide the code with information on a state, the size of the circuit becomes larger than the Bitabi detection circuit composing the ordinary PRML transmission system.

In order to solve this problem, the time-varying Trellis coding described above is adopted. In the time-varying Trellis coding and the detection (decoding) thereof, however, Bitabi detection is carried out by using a 3-channel (3-time) clock signal, time control for the Bitabi detection is cumbersome and, in addition, the code maximum inversion interval [corresponding to (k+1) of a (d, k) restriction in the (d, k : m, n, r) code] becomes longer, making an overwrite operation difficult to perform accordingly. Moreover, the constraint length also increases, giving rise to a problem that a larger memory size is required for the encoder 13 and the decoder 26.

SUMMARY OF THE INVENTION

It is thus an object of the present invention addressing the problems described above to provide a coding apparatus and a decoding apparatus wherein the time control is simple, the number of codes that can be used (selected) in the encoder is increased and the maximum inversion interval as well as the constraint length are shortened without reducing the coding rate.

As a result, it is possible to provide a coding apparatus and a decoding apparatus which are suitable for a transmission system such as a digital recording/reproducing system as well as proof against noise and distortion and does not entail an increase in circuit size.

In order to solve the problems described above, the present invention provides a coding apparatus according to first aspect of the present invention characterized in that said coding apparatus has an encoder for coding an input data train to produce a train of codes comprising an even number of codes as a result of restricting 3 consecutive transiting consistent codes starting at an odd-numbered or even-numbered clock pulse of a channel clock signal and restricting all 4 consecutive transiting consistent codes.

In addition, according to third aspect of the present invention, there is provided a decoding apparatus characterized in that said decoding apparatus is used for carrying out a process of decoding a train of codes obtained as a result of coding by restricting 3 consecutive transiting consistent codes starting at an odd-numbered or even-numbered clock pulse of a channel clock signal and restricting all 4 consecutive transiting consistent codes, said decoding apparatus having a Bitabi detector whereby, after completing partial-response equalization in said decoding process, a reproduced train of codes is subjected to maximum-likelihood decoding and Trellis path time restriction is implemented during said maximum-likelihood decoding.

Moreover, according to sixth aspect of the present invention, there is provided a coding apparatus characterized in that said coding apparatus is used for producing a train of codes with an odd constraint length of at least 3 where said constraint length is the number of bits in said train of codes wherein said train of codes does not include 3 consecutively transiting consistent codes starting with an odd-numbered code, any 4 consecutively transiting consistent codes and codes starting with 2 consecutively transiting consistent codes.

Furthermore, according to eighth aspect of the present invention, there is provided a decoding apparatus characterized in that said decoding apparatus is used for carrying out a process of decoding a train of codes obtained as a result of coding carried out so that said train of codes has an odd constraint length of at least 3 where said constraint length is the number of bits in said train of codes and said train of codes does not include 3 consecutively transiting consistent codes starting with an odd-numbered code, any 4 consecutively transiting consistent codes and codes starting with 2 consecutively transiting consistent codes, said decoding apparatus having a Bitabi detector whereby, after completing partial-response equalization in said decoding process, a reproduced train of codes is subjected to maximum-likelihood decoding and Trellis path time restriction is implemented during said maximum-likelihood decoding.

According to the present invention, in implementing a time-varying Trellis coding process which allows the size of the circuit to be reduced, for an even time constraint, 3 consecutive transiting consistent codes starting at an odd-numbered or even-numbered clock pulse of a channel clock signal and all 4 consecutive transiting consistent codes are restricted in order to increase the shortest intercede distance as much as possible, and a resulting train of codes is treated as data to be recorded, that is, a train of codes to be recorded.

For an odd time constraint, on the other hand, an input train of codes is decoded while imposing restrictions thereon so that a resulting train of codes does not include 3 consecutively transiting consistent codes starting with an odd-numbered code, any 4 consecutively transiting consistent codes and codes starting with 2 consecutively transiting consistent codes.

As the partial-response equalization, the $E^2PR4$ (Extended Extended Partial Response Class 4) equalization technique or the $E^3PR4$ (Extended Extended Extended Partial Response Class 4) equalization technique is adopted. A train of codes is detected by adopting a combination of the PR equalization and maximum-likelihood decoding.

BRIEF DESCRIPTION OF THE DRAWINGS

FIG. 1 is a block diagram showing a recording/reproducing apparatus adopting the conventional coding and decoding methods;

FIG. 2 is a block diagram showing a conventional recording/reproducing apparatus.

FIG. 5 is a table showing combinations of smallest distances obtained as results of restricting 4 consecutively transiting consistent codes by adopting the $E^2PR4$ equalization technique;

FIG. 6 is a table showing combinations of second smallest distances obtained as results of restricting 4 consecutively transiting consistent codes by adopting the $E^2PR4$ equalization technique;

FIG. 8 is a table showing the number of codes obtained as results of $E^2PR4$ restriction taking remainders into consideration;

FIG. 9 is a table showing the number of codes obtained as results of $E^2PR4$ restriction taking remainders into consideration in the prior art;

FIG. 10 is a diagram showing a typical table of 16/18 time-varying Trellis coding for Q=0;

FIG. 11 is a diagram showing a typical table of 16/18 time-varying Trellis coding for Q=1;

FIG. 15 is a block diagram showing a typical ACS circuit for Bitabi detection;

FIG. 17 is an $E^2PR4$ time-varying Trellis diagram for Q=1 and an even constraint length;

FIG. 20 is a diagram showing a typical table of 8/9 time-varying Trellis coding (Part 1);

FIG. 21 is a diagram showing a typical table of 8/9 time-varying Trellis coding (Part 2);

FIG. 24 is a diagram showing combinations of smallest distances which are obtained when 4 consecutive transiting consistent codes are restricted by adopting the $E^3PR4$ equalization technique (Part 1);

FIG. 25 is a diagram showing combinations of smallest distances which are obtained when 4 consecutive transiting consistent codes are restricted by adopting the $E^3PR4$ equalization technique (Part 2);

FIG. 26 is a diagram showing combinations of smallest distances which are obtained when 4 consecutive transiting consistent codes are restricted by adopting the $E^3PR4$ equalization technique (Part 3);

FIG. 27 is a diagram showing combinations of smallest distances which are obtained when 4 consecutive transiting consistent codes are restricted by adopting the $E^3PR4$ equalization technique (Part 4);

DETAILED DESCRIPTION OF THE PREFERRED EMBODIMENTS

Figure 3:
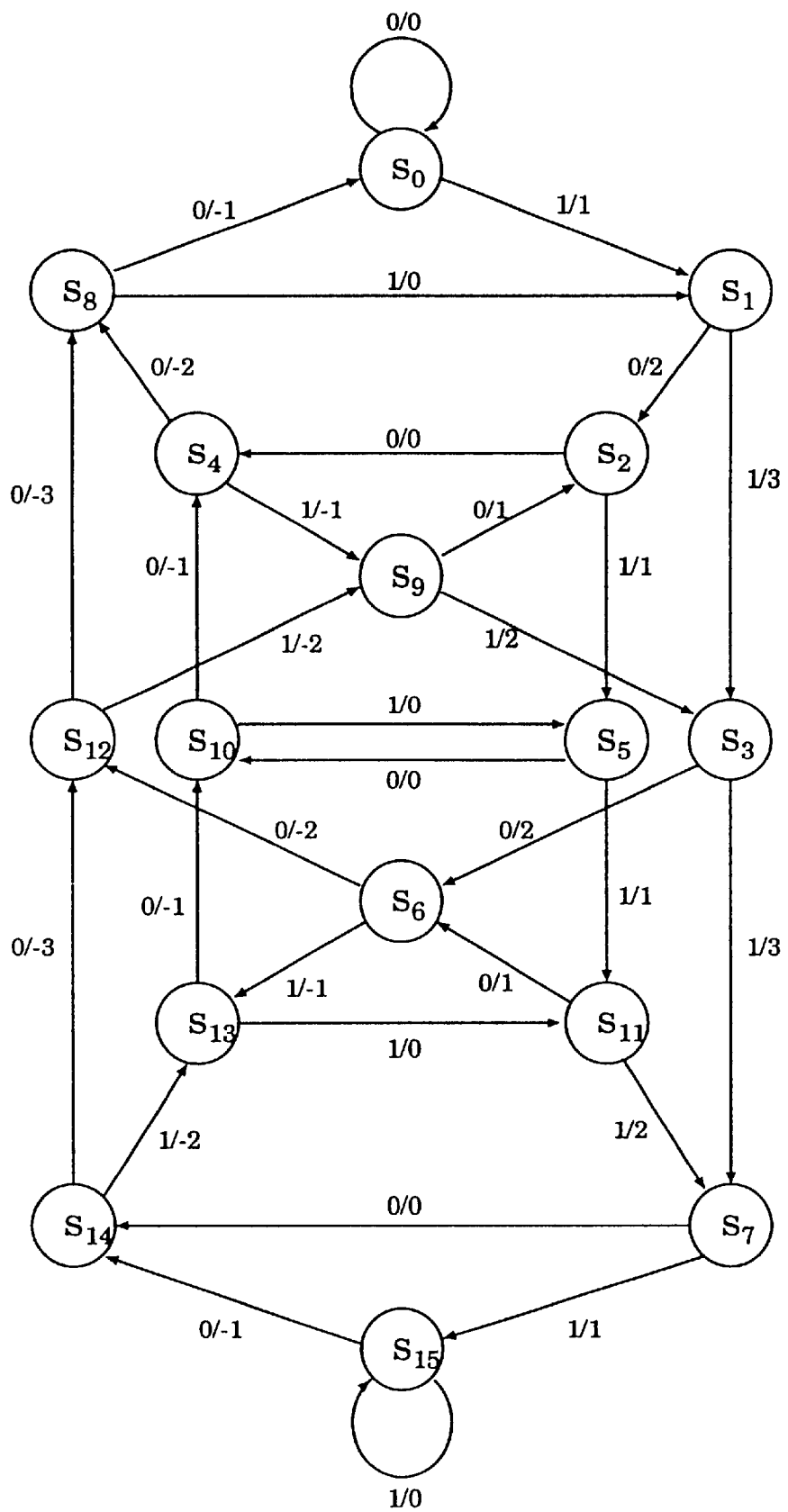
FIG. 3 is a diagram showing state transitions of an $E^2PR4$ equalization technique.

Next, embodiments implementing a coding apparatus and a decoding apparatus provided by the present invention as applied to a digital magnetic disc recording/reproducing apparatus are explained in detail by referring to accompanying diagrams. As partial-response equalization, methods such as the $E^2PR4$ and $E^3PR4$ equalization techniques are considered to be possible methods. In the first embodiment, the time-varying Trellis coding is applied to the $E^2PR4$ equalization technique.

FIG. 2 is a block diagram showing a recording/reproducing apparatus 10 as an example of the digital magnetic disc recording/reproducing apparatus to which the present invention is applied. The configuration of the recording/reproducing apparatus 10 shown in the figure is the same as that shown in FIG. 1. As shown in FIG. 2, the recording/reproducing apparatus 10 comprises a coding unit 10A and a decoding unit 10B.

In the coding unit 10A, data to be recorded coming from an input terminal 12 (typically, 16-bit data) is converted into a 18-bit code train by an encoder 13. As will be described later, among trains of codes with a length of 18 bits, there exist some trains of codes that can not be used. Details will be described later. The train of codes with a converted bit rate is supplied to a recording head 16 by way of an amplifier 14 to be recorded into a recording medium 15. As the recording medium 15, a magnetic disc or the like can be used.

On the other hand, a train of codes played back from the recording medium 15 by a reproducing head 21 is supplied to an equalizer 30 by way of an amplifier 22. The equalizer 23 and the amplifier 22 are components composing the decoder 10B. In the equalizer 30, the train of codes is subjected to partial-response equalization adopting the $E^2PR4$ equalization technique.

Let the symbol D represent a unit delay time of a channel clock signal. In this case, the equalizer 30 can be represented by the following interference polynomial $(1-D)(1+D)^3$ which can be factorized as follows:

$$(1-D)(1+D)^3 = (1-D)(1+D)(1+D)^2$$

The above expression indicates that the equalizer 30 can implemented by a PR4 equalizer and a 2-stage filter.

Thus, as shown in FIG. 2, the equalizer 30 includes a PR4 equalizer 31. An output waveform output by the PR4 equalizer 31 is supplied to a PLL circuit 32. In the PLL circuit 32, a channel clock signal CK is extracted from the output waveform and supplied to a sampler (sampling circuit) 33 for sampling the waveform completing the equalization. At a later stage of the equalizer 30, digital filters 34 and 35 are provided to form a cascade connection at 2 stages. The configuration of the digital filter 34 is identical to that of the digital filter 35. To put it in detail, the digital filters 34 and 35 each comprise a unit delay element D for delaying a signal by 1 channel clock period and an adder. As described above, the $E^2PR4$ equalizer 30 thus includes the PR4 equalizer 31 and the filters 34 and 35.

A signal output by the equalizer 30 is supplied to a Bitabi detector 40 to be subjected to maximum-likelihood decoding. Codes completing the maximum-likelihood decoding are then supplied to a decoder 26 for performing decoding, that is, reversed processing of the encoder 13. The decoder 26 decodes the codes to produce back the input data train which is finally output to an output terminal 27.

Figure 4:
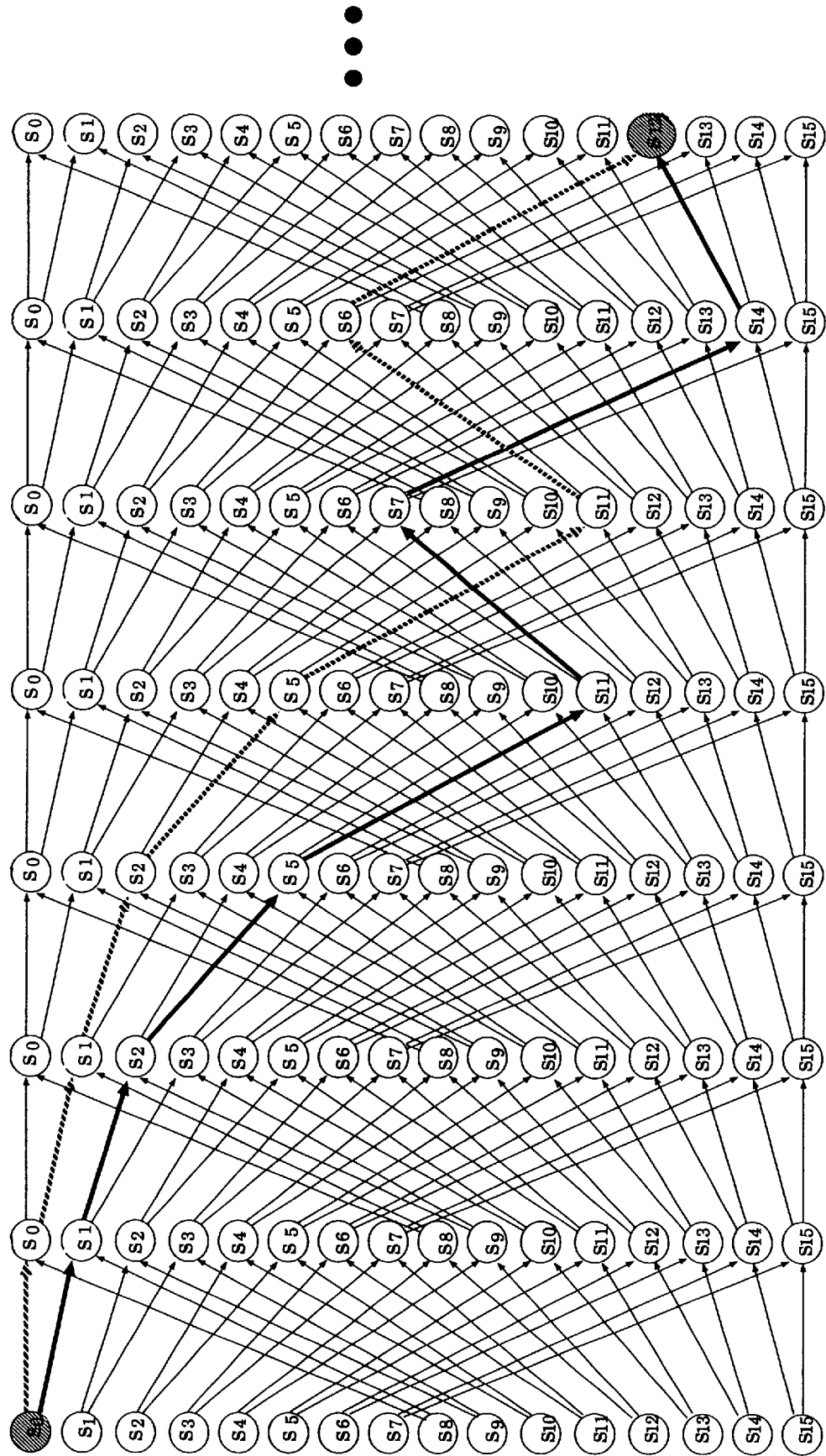
FIG. 4 shows an $E^2PR4$ Trellis diagram.

FIG. 3 is a diagram showing state transitions of the $E^2PR4$ equalization technique. As shown in the figure, each path is marked with notation (input)/(output). FIG. 4 shows part of a Trellis diagram obtained as a result of expansion of the state-transition diagram shown in FIG. 3 along the time axis.

When this Trellis diagram is timewise searched exhaustively to examine intercode distances, the shortest intercede distance is found to be $\sqrt{6}$ whereas a second shortest intercode distance is found to be $\sqrt{8}$. By an intercode distance, the Euclid distance is meant. Thus, an intercede distance is computed as follows. Among combinations each comprising 2 paths branching from a certain state, the square root of a sum of squares of differences between output values at each time at which paths are merged into any arbitrary state is computed. The shortest intercede distance is obtained as its minimum value. It is known that the shortest intercede distance has an effect on the error rate. The greater the shortest intercode distance, the better the error rate is improved.

For this reason, according to the present invention, a train of codes output by the encoder 13 is selected so as to increase the shortest intercede distance. In order to increase the shortest intercede distance, it is necessary to configure a train of codes so as to satisfy at least the following 2 conditions.

(1) In NRZI (non return to zero inverted) code for representing inversion of a code by 1 and the absence of inversion by 0, 4 consecutively transiting consistent codes (1, 1, 1, 1) are restricted. That is, in the encoder 13, such a train of codes (1, 1, 1, 1) is not selected.

(2) 3 consecutively transiting consistent codes starting from either odd-numbered or even-numbered channel clock pulse of the channel clock signal are restricted. That is, such a train of codes is not selected. With the number of bits in a train of codes output by the encoder 13 set at the constraint length, this 2nd condition varies in dependence on whether the constraint length is odd or even. The condition described above is a condition for an even constraint length.

Condition (1) described above is no other than prohibition of a transition between states $S_5$ and $S_{10}$ shown in FIG. 3. A result of examination of intercede distances under this condition indicates that the shortest intercede distance and a second shortest intercode distance do not change. However, a characteristic appears in each of combinations composing the distances.

In addition, if 3 consecutively transiting consistent codes are deleted by taking timing of the channel clock signal into consideration and 4 consecutively transiting consistent codes are always restricted as described above, a certain path of the Trellis diagram is not passed through any more. Thus, this path can be excluded from paths to be detected by the Bitabi detection. As a result, the shortest intercode distance is improved by being made greater than the conventional value from $\sqrt{6}$ to $\sqrt{10}$.

There exist only 32 different patterns of codes having the shortest intercede distance obtained as a result of the restriction of 4 consecutively transiting consistent codes when expressed by the NRZ (non return to zero) representation as shown in FIG. 5. In the figure, notations si and sm represent branching and merging states respectively. FIG. 4 is a diagram showing a combination of si=0 and sm=12 (dashed and solid lines).

A similar characteristic also appears in a combination of the second shortest intercede distance obtained as a result of the restriction of 4 consecutively transiting consistent codes. In this case, there exist 32 different patterns of codes having such a second shortest intercede distance when expressed by the NRZ representation as shown in FIG. 6.

All the patterns shown in FIGS. 5 and 6 each include 3 consecutively transiting consistent codes (1, 1, 1) if a path before arriving at a state si is also taken into consideration in terms of NRZI representations. These 3 consecutively transiting consistent codes are explained by referring to FIGS. 7A and 7B.

Figure 7A:
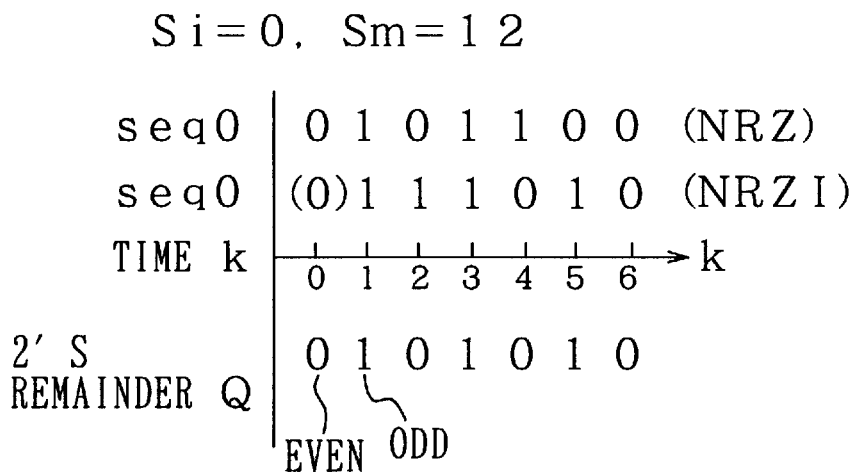
FIGS. 7A and 7B are diagrams each showing a relation between codes and 2's remainders.

For example, an NRZI representation of sequence 0 (an NRZ representation) for a pair of state si=0 and state sm=12 is shown in FIG. 7A. Let times k be collated with sequence 0 and let Q be the 2's remainder at the times k. As shown in the figure, the 2's remainder Q repeatedly and alternately changes from 0 at an even value of the time k to 1 at an odd value of the time k as the time k increases.

Figure 7B:
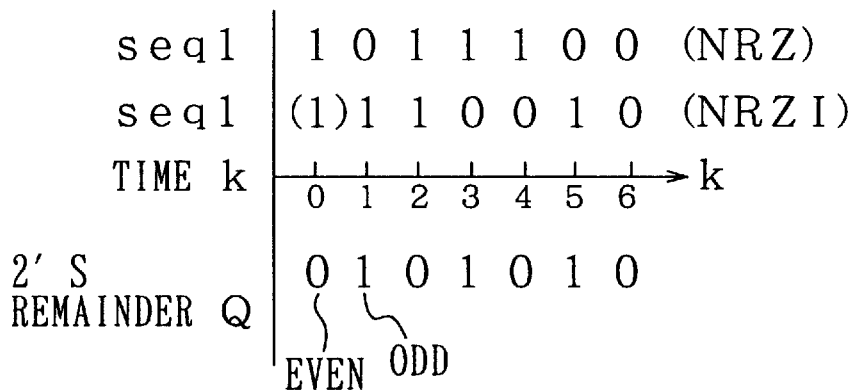

On the other hand, an NRZI representation and the 2's remainders Q for sequence 1 are shown in FIG. 7B.

It is obvious from in FIGS. 7A and 7B that the NRZI representations each include 3 consecutively transiting consistent codes (1, 1, 1). It should be noted that, in the case of the NRZI representation shown in FIG. 7A, the 3 consecutively transiting consistent codes are generated at an odd value of the remainder Q (Q=1) while, in the case of the NRZI representation shown in FIG. 7B, the 3 consecutively transiting consistent codes are generated at an even value of the remainder Q (Q=0). Thus, in order to delete 3 consecutively transiting consistent codes, it is necessary to carry out processing which considers the remainder Q used to represent timing of the channel clock signal as described above.

Relations of 4 consecutively transiting consistent codes and 3 consecutively transiting consistent codes are explained for 2 cases in which the remainder Q=0 and the remainder Q=1 hold true respectively.

(I) The remainder Q=0 with a constraint length for even block codes 3 consecutively transiting consistent codes starting at a 0 value of the remainder Q are restricted and, as for a constraint length to restrict all 4 consecutively transiting consistent codes, even block codes are taken into consideration. In this case, there are 3 different positions of a block boundary for restricting all 4 consecutively transiting consistent codes as follows.

| | | | | |
|---|---|---|---|---|
| 1 | | 1 | 1 | 1 |
| 1 | 1 | | 1 | 1 |
| 1 | 1 | 1 | | 1 |

The symbol | represents a block boundary. In order to maximize the number of block codes that can be selected, as much relief of conditions of restriction as possible is taken into consideration. Accordingly, (1, 1, 1) or (1, 1) of the first part of the block and (1, 1) or (1, 1, 1) of the later part of the block are restricted.

As for block boundary in 3 consecutively transiting consistent codes, there are 2 different positions as follows:

| | | | |
|---|---|---|---|
| Q = | 1 | 0 | 1 |
| NRZI code | 1 | 1 | 1 |
| Q = | 0 | 1 | 0 |
| NRZI code | 1 | 1 | 1 |

Since the constraint length is an even number, codes that start at Q=0 are the latter codes only. Thus, in order to maximize the number of block codes that can be selected, as much relief of conditions of restriction as possible is taken into consideration. Accordingly, only (1, 1) at the end of the block is restricted.

The conditions described above are summarized as follows. In oder to restrict 3 consecutively transiting consistent codes starting at Q=0 and to restrict all 4 consecutively transiting consistent codes:

1 NRZI codes ending with (1, 1) are eliminated.
2 NRZI codes starting with (1, 1, 1) are eliminated.
3 NRZI codes including (1, 1, 1, 1) are eliminated.
4 NRZI codes including 1, 1, 1 starting at Q=0 are eliminated. Thus, codes to be output by the encoder 13 need to be restricted according to the conditions summarized above.

The number of codes possibly obtained as a result of the above restriction is shown in FIG. 8 for each transformation m/n. By the way, for reference, the number of codes possibly obtained by adopting the conventional method is shown in FIG. 9 for each transformation m/n. In FIGS. 8 and 9, k restriction is selected to minimize the value of k, where k is the number of consecutive 0s in the NRZI code, without decreasing the transformation rate of codes. In addition, being block codes, codes of all 0s, that is, codes with no transition at all, are not included in the counted number of possibly obtained codes.

By using the code of the 2's remainder Q as described above, the 18/20 transformation with a transformation efficiency better than the 16/18 transformation becomes possible as shown in FIG. 8. By adopting the conventional technique, on the other hand, the 18/20 transformation is impossible as shown in FIG. 9.

FIG. 10 shows a part of a typical ROM table included in the encoder 13. The table shows possible codes starting with the 2's remainder Q having a value of 0. Thus, the table shown in FIG. 10 shows typical 16/18 time-varying Trellis codes for Q=0 and an even constraint length.

(II) The remainder Q=1 with a constraint length for even block codes

Condition of restricting all 4 consecutively transiting consistent codes are the same as case (I). Consider restriction of 3 consecutively transiting consistent codes starting from Q=1. For a block boundary in 3 consecutively transiting consistent codes, there are 2 different positions as follows:

| | | | |
|---|---|---|---|
| Q = | 1 | 0 | 1 |
| NRZI code | 1 | 1 | 1 |
| Q = | 0 | 1 | 0 |
| NRZI code | 1 | 1 | 1 |

Thus, codes that start at Q=1 are the former codes only. Thus, in order to maximize the number of block codes that can be selected, as much relief of conditions of restriction as possible is taken into consideration. Accordingly, only (1, 1) at the start of the block is restricted.

The conditions described above are summarized as follows.

1. NRZI codes starting with (1, 1) are eliminated.
2. NRZI codes ending with (1, 1, 1) are eliminated.
3. NRZI codes including (1, 1, 1, 1) are eliminated.
4. NRZI codes including 1, 1, 1 starting at Q=1 are eliminated. Codes are restricted under the conditions described above. The number of codes obtained as a result of this restriction is the same as the restriction for Q=1.

FIG. 11 shows a part of a typical ROM table included in the encoder 13. The table shows possible codes starting with the 2's remainder Q having a value of 1. Thus, the table shown in FIG. 11 shows typical 16/18 time-varying Trellis codes for Q=1 and an even constraint length.

Encoding rules vary in dependence on the value of the reminder Q as shown in conditions (I) and (II). In an actual circuit configuration, however, either encoding rules (I) or (II) selected. Thus, either the table shown in FIG. 10 or 11 is adopted in the encoder 13.

In the Bitabi detector (strictly speaking, the $E^2PR4$ Bitabi detector) 40 for detecting time-varying Trellis codes when restricting 3 consecutively transiting consistent codes under conditions (I) described above, the lapse of time varies as shown in FIG. 12. That is, when expressed in terms of the reminder Q, the path in use and the state Si in use vary in dependence on whether the remainder Q has a value of 0 or 1. Thus, time control (2 channel clocks or 2 times) is required in the path and the state. In the Trellis diagram shown in FIG. 12, paths and states shown by dashed lines are paths and states that are not used.

Figure 13:
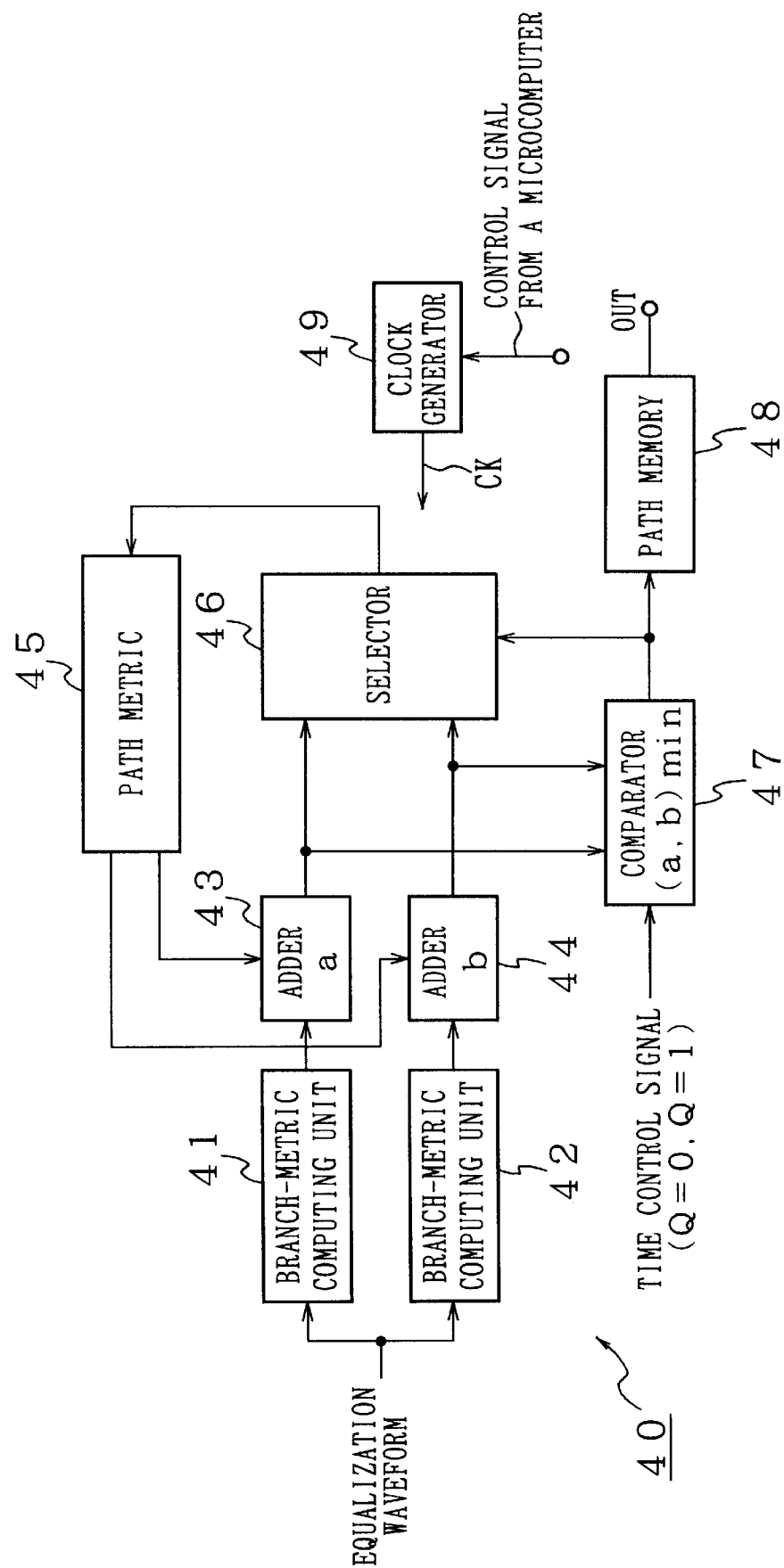
FIG. 13 is a block diagram showing a typical ACS circuit for Bitabi detection.

FIG. 13 is a diagram showing an example of the Bitabi detector 40 for the remainder Q having a value of 0 (or coding rules I).

As shown in FIG. 3, there are 16 states. As many 2-input Bitabi detectors 40 shown in FIG. 13 as the states are provided. As shown in FIG. 13, having adders 43 and 44, a comparator 47 and a selector 46, the Bitabi detector 40 is also called a 2-input ACS (Add Compare Select) circuit. The figure shows an ACS circuit used for the state si.

Figure 12:
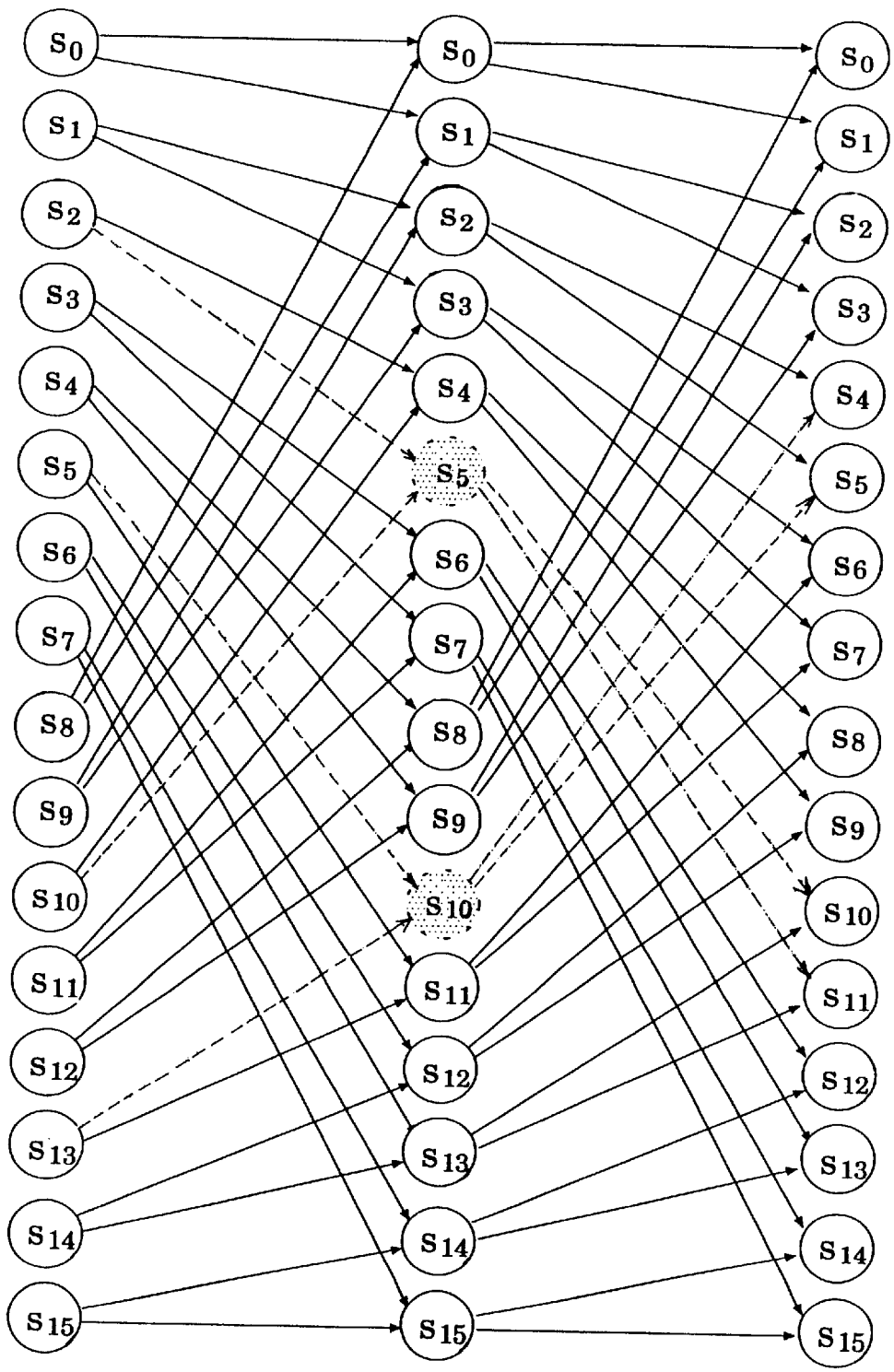
FIG. 12 is an $E^2PR4$ time-varying Trellis diagram for Q=0 and an even constraint length.

It is obvious from the time-varying Trellis diagram shown in FIG. 12 that, in the case of an even time, that is, in the case of Q=0 for the Q expression, the ASC circuits for states $S_5$ and $S_{10}$ are not used so that all the circuits are controlled to an inoperative state. To do so, it is necessary to typically cut off the output path of a channel clock generating circuit 49.

Since an ACS circuit for another state performs Bitabi detection, the comparator 47 compares results of addition output by the adders 43 and 44 to determine which result is smaller.

In the case of an even time, that is, in the case of Q=1, it is obvious from FIG. 12 that, in states $S_4$, $S_5$, $S_{10}$ and $S_{11}$, there is only one input. Thus, the comparator 47 operates to select only the 1 connected path. An ACS operation is explained below by picking up some states.

Operation for si=0

In a branch-metric computing unit 41 employed in the ACS circuit shown in FIG. 13, an input equalization waveform yin is received to compute $bm_{00}$ as follows:

$$bm_{00}=y_{in}^2 \quad (1)$$

By the same token, in a branch-metric computing unit 42 employed in the ACS circuit shown in FIG. 13, the input equalization waveform $y_{in}$ is received to compute $bm_{80}$ as follows:

$$bm_{80}=(y_{in}+1)^2 \quad (2)$$

In a path metric 45, path metrics of states at a time preceding the present time by 1 time unit are stored and associated with $bm_{00}$ and $bm_{80}$. To put it in detail, the adder 43 adds a path metric $pm_0$ of state si=0 (S0) to $bm_{00}$ and the adder 44 adds a path metric $pm_8$ of state S8 to $bm_{80}$.

The comparator 47 compares the result of addition output by the adder 43 to that of the adder 44, outputting a signal indicating which result is smaller. In the case of state S0, metrics of 2 inputs are always compared. Thus, the comparator 47 does not require a time control signal.

The signal output by the comparator 47 is supplied to the selector 46 for passing on the smaller between the results of addition produced by the adders 43 and 44 in accordance with the signal. The path metric 45 receives the result of addition passed on by the selector 46, storing the result in the corresponding path metric, that is, in $pm_0$ in this case. On the other hand, a path memory 48 stores a path passed through in the past depending on the signal output by the comparator 47. The path is output by the path memory 48 to the decoder 26 in synchronization with the channel clock signal CK.

Operation in State S4

During the operation for state S4, in the branch-metric computing unit 41 employed in the ACS circuit, an input equalization waveform $y_{in}$ is received to compute $bm_{24}$ as follows:

$$bm_{24}=y_{in}^2 \quad (3)$$

By the same token, in the branch-metric computing unit 42 employed in the ACS circuit, the input equalization waveform $y_{in}$ is received to compute $bm_{104}$ as follows:

$$bm_{104}=(y_{in}+1)^2 \quad (4)$$

In the path metric 45, path metrics of states at a time preceding the present time by 1 time unit are stored and associated with $bm_{24}$ and $bm_{10}4$. To put it in detail, the adder 43 adds a path metric $pm_2$ of state S0 to $bm_{24}$ and the adder 44 adds a path metric $pm_{10}$ of state S8 to $bm_{104}$.

The comparator 47 compares the result of addition output by the adder 43 to that of the adder 44 for Q=0, outputting a signal indicating which result is smaller. For Q=1, the comparator does not compare the results of addition, outputting a signal indicating the result of addition produced by the adder 43. Thus, since the comparator 47 carries out different kinds of processing in dependence on whether Q=0 or Q=1, the comparator 47 requires a time control signal.

The selector 46, the path metric 45 and the path memory 48 carry out the same operations as state S0 described above.

ACS Operation in State S5

In state S5, the ACS operation is prohibited completely for Q=0. For Q=1, on the other hand, a predetermined operation is carried out.

The ACS circuit provided to keep up with a variety of states as described above requires double time control. On the other hand, since processing in 2-bit units is carried out for the 2 times only once, the time control is not required. In this case, a time-varying Trellis diagram of FIG. 14 with block heads coinciding with each other is used.

Figure 14:
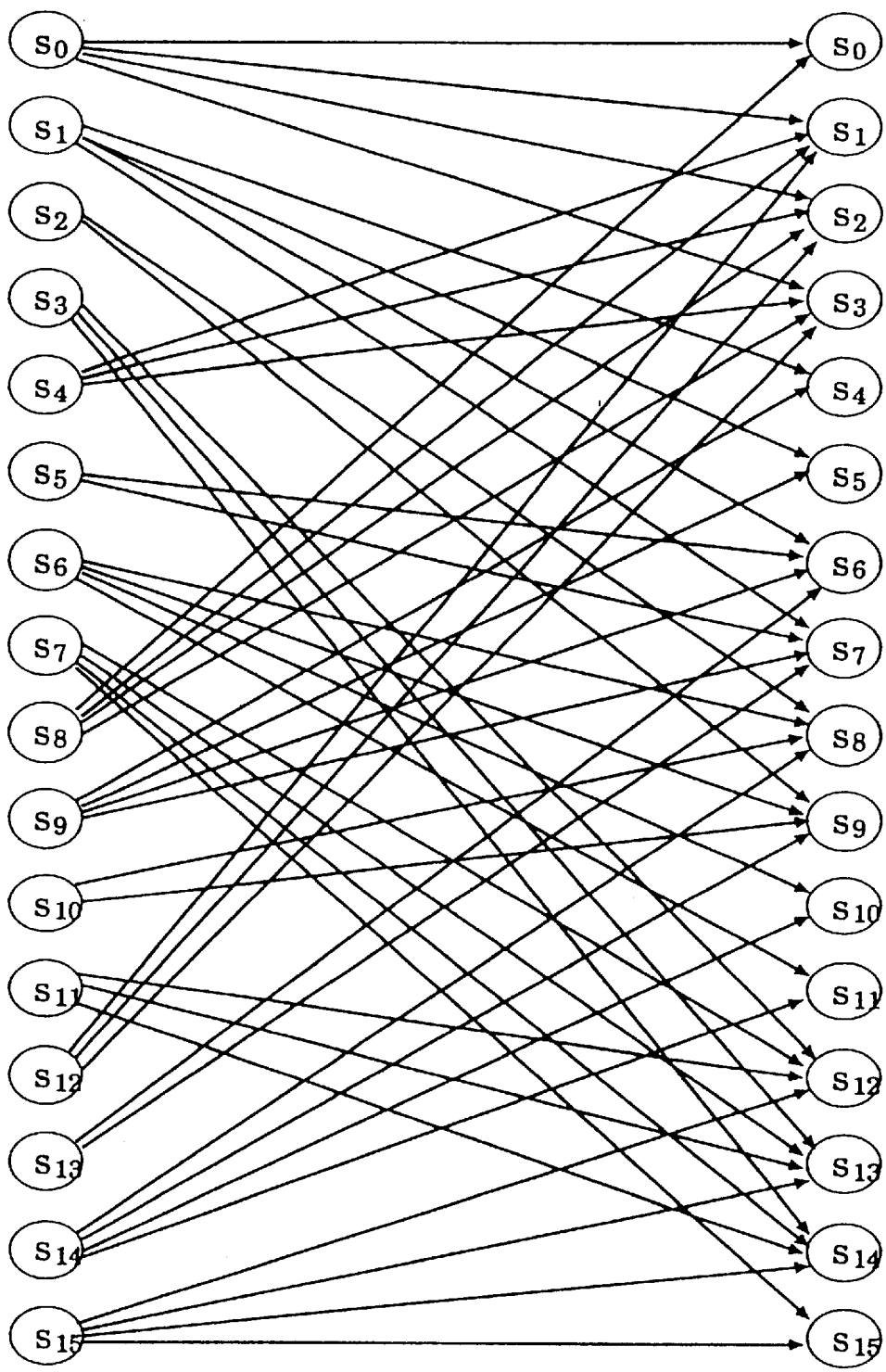
FIG. 14 is an $E^2PR4$ time-varying Trellis diagram for a case in which 2-time processing is carried out for Q=0 and an even constraint length.

When the time control is not required, it is obvious from the time-varying Trellis diagram of FIG. 14 that the ACS circuits for states $S_0$, $S_4$, $S_5$, $S_{10}$, $S_{11}$ and $S_{15}$ each have a 2-input circuit configuration and, for other states, an ACS circuit with a 4-input circuit configuration is used.

The 2-input ACS circuit is no other than the circuit shown in FIG. 13. FIG. 15 is a diagram showing a 4-input ACS circuit. The configuration shown in FIG. 15 is obtained by connecting two 2-input portions of the configuration shown in FIG. 13 in parallel. Both the 2-input ACS circuit and the 4-input ACS circuit do not require time control and 1 processing is carried out for 2 times. An example is shown as follows.

Operation in State S1

In state S1, the 4 inputs are processed as follows.

In the branch-metric computing unit 51 employed in the ACS circuit shown in FIG. 15, $$bm_{01} = y_{in}^2 + (y_{in} - 1)^2 \quad (5)$$

In the branch-metric computing unit 52 employed in the ACS circuit shown in FIG. 15, $$bm_{41} = (y_{in} + 2)^2 + y_{in}^2 \quad (6)$$

In the branch-metric computing unit 53 employed in the ACS circuit shown in FIG. 15, $$bm_{81} = (y_{in} + 1)^2 + (y_{in} - 1)^2 \quad (7)$$

In the branch-metric computing unit 54 employed in the ACS circuit shown in FIG. 15, $$bm_{121} = (y_{in} + 3)^2 + y_{in}^2 \quad (8)$$

An adder 55 adds path metric $p_0$ for a time preceding the present time by 2 time units to $bm_{01}$ and an adder 56 adds path metric $p_4$ for a time preceding the present time by 2 time units to $bm_{41}$. On the other hand, an adder 57 adds path metric $p_8$ for a time preceding the present time by 2 time units to $bm_{81}$ and an adder 58 adds path metric $p_{12}$ for a time preceding the present time by 2 time units to $bm_{121}$.

A comparator 61 outputs a signal indicating the smallest among 4 results of addition produced by the adders 55 to 58 respectively. A selector 60 receives the signal output by the comparator 61 and passes on one of the 4 results of addition produced by the adders 55 to 58 respectively indicated by the signal. A path metric 59 stores the result of addition passed on by the selector 60 in a predetermined path metric, that is, pm, in this case. A path memory 62 updates a path passed through in the past based on the signal output by the comparator 61. Contents of a memory employed in the path memory 62 are supplied to the decoder 26.

Operation in State S0

In state S0, 2 inputs are received and processed as follows.

In the branch-metric computing unit 41 employed in the ACS circuit shown in FIG. 13, $$bm_{00} = y_{in}^2 + y_{in}^2 \quad (9)$$

In the branch-metric computing unit 42 employed in the ACS circuit shown in FIG. 13, $$bm_{80} = (y_{in} + 1)^2 + (y_{in} - 1)^2 \quad (10)$$

The adder 43 adds path metric $p_0$ for a time preceding the present time by 2 time units to $bm_{00}$ and an adder 44 adds path metric $p_8$ for a time preceding the present time by 2 time units to $bm_{80}$. The comparator 47 outputs a signal indicating the smallest among 2 results of addition produced by the adders 43 and 44 respectively. The selector 46 receives the signal output by the comparator 47 and passes on one of the 2 results of addition produced by the adders 43 and 44 respectively indicated by the signal.

The path metric 45 sores the result of addition passed on by the selector 46 in a predetermined path metric, that is, $pm_0$ in this case. The path memory 48 updates a path passed through in the past based on the signal output by the comparator 47.

As described above, decoding and coding using the encoder 13 for carrying out 16/18 transformation are carried out in a way that, when the remainder Q has a value of 0, that is, in the case of encoding rules (I), 3 consecutively transiting consistent codes are restricted and 4 continuous restriction codes are always restricted. As a result, the shortest intercode distance can be improved over the conventional value.

Figure 16:
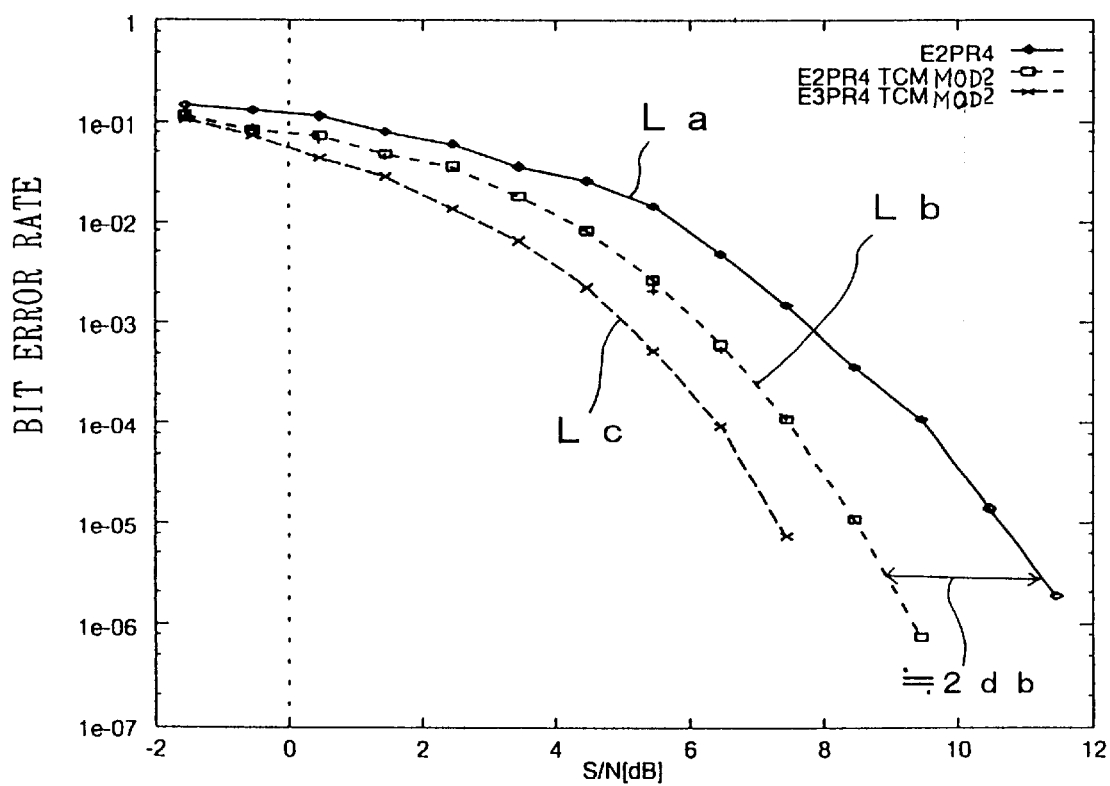
FIG. 16 is a diagram showing noise-margin characteristics.

FIG. 16 is a characteristic diagram used for explaining results of this improvement. In the case of curve La, the $E^2PR4$ equalization technique is adopted as a partial-response equalization method. Curve La is a characteristic curve for a case in which the restriction described above is not implemented, that is, a characteristic curve of the conventional method. Also in the case of curve Lb, the $E^2PR4$ equalization technique is adopted as a partial-response equalization method. However, Curve Lb is a characteristic curve for a case in which codes are restricted as is the case with the present invention.

Comparison of the 2 curves indicates that the noise margin is increased by $20 \log (\sqrt{10}/\sqrt{6}) = 2.218$ dB, making it obvious that effects of the improvement appear strikingly.

So far, the configuration and the operation of the Bitabi detector for the 2's remainder having a value of 0 have been described. When the remainder Q having a value of 1 is selected in place of the remainder Q with a value of 0, that is, in the case of coding rules (II), the Bitabi detector 40 for detecting an $E^2PR4$ time-varying Trellis code to be used operates as is described as follows.

For Q=1, a time-varying Trellis diagram for an even constraint length is shown in FIG. 17. Thus, also in this case, different kinds of ACS processing for even and odd times are carried out in specific states. Accordingly, time control shown in FIG. 17 is executed to detect codes while imposing restrictions on paths and states depending on whether the time is even or odd, that is, depending on the value of the remainder Q.

However, this circuit carries out an operation to swap times corresponding to Q=0 and Q=1 with each other in the sequential Bitabi detector for detecting $E^2PR4$ time-varying Trellis codes for restricting 3 consecutively transiting consistent codes for Q=0. Thus, explanation of detailed operations is omitted.

Figure 18:
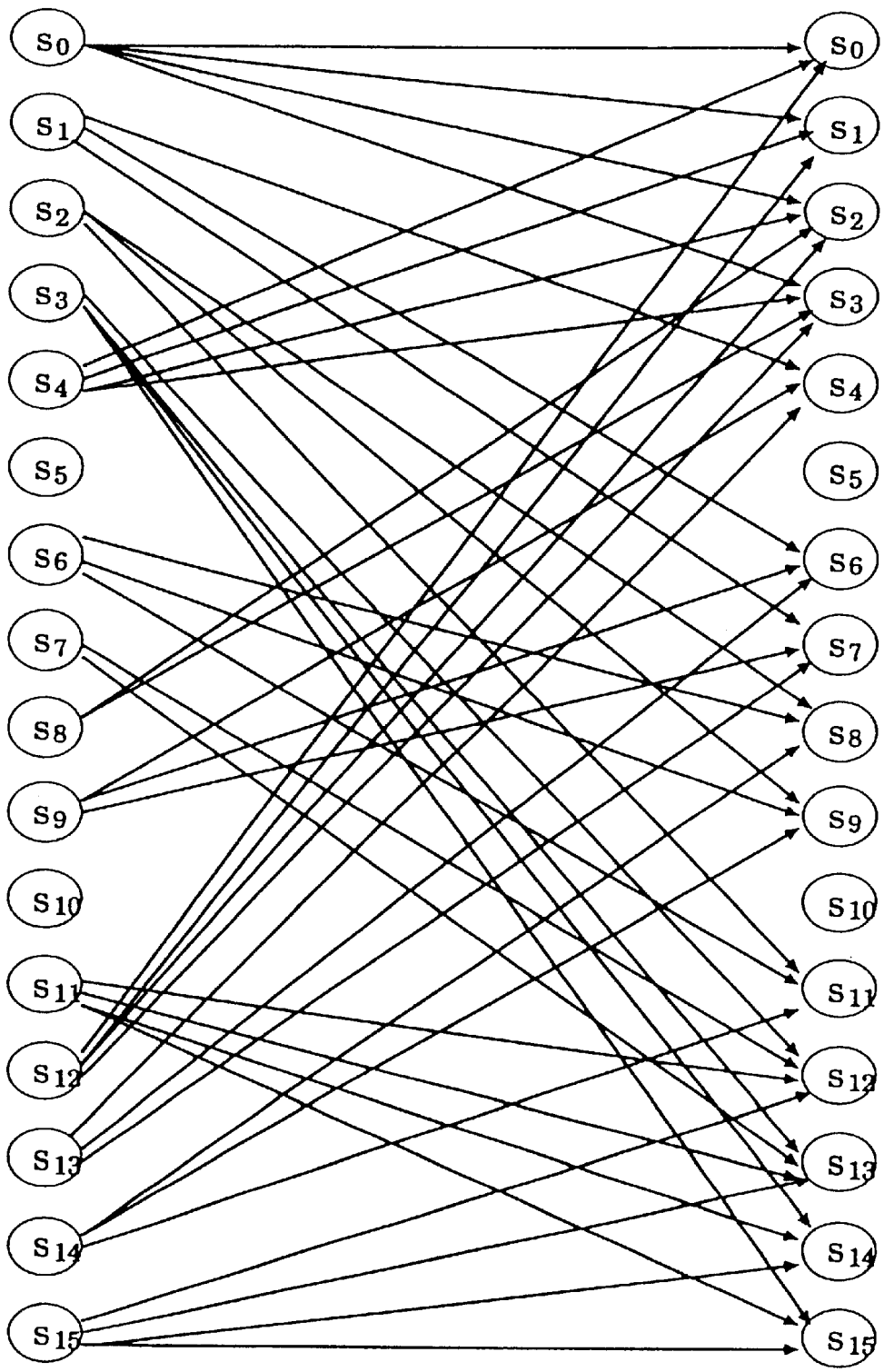
FIG. 18 is an $E^2PR4$ time-varying Trellis diagram for a case in which 2-time processing is carried out for Q=1 and an even constraint length.

In addition, when processing at 2 times requiring no time control is carried out once in 2-bit units, a time-varying Trellis diagram with block heads coinciding with each other as shown in FIG. 18 is used. In this case, the number of states decreases by 2. In 14 states, the ACS circuit, that is, the Bitabi detector 40, can be configured.

It is also obvious from FIG. 18 that, since states $S_5$ and $S_{10}$ do not exist, the ACS circuits for these states also do not exist. In states $S_0$, $S_1$, $S_4$, $S_6$, $S_7$, $S_8$, $S_9$, $S_{11}$, $S_{14}$ and $S_{15}$, 3 inputs exist. Thus, a 3-input ACS circuit is used. In other states, a 4-input ACS circuit is used. As 2-input and 4-input ACS circuits, ones with the same configurations as those described earlier can be used.

Figure 19:
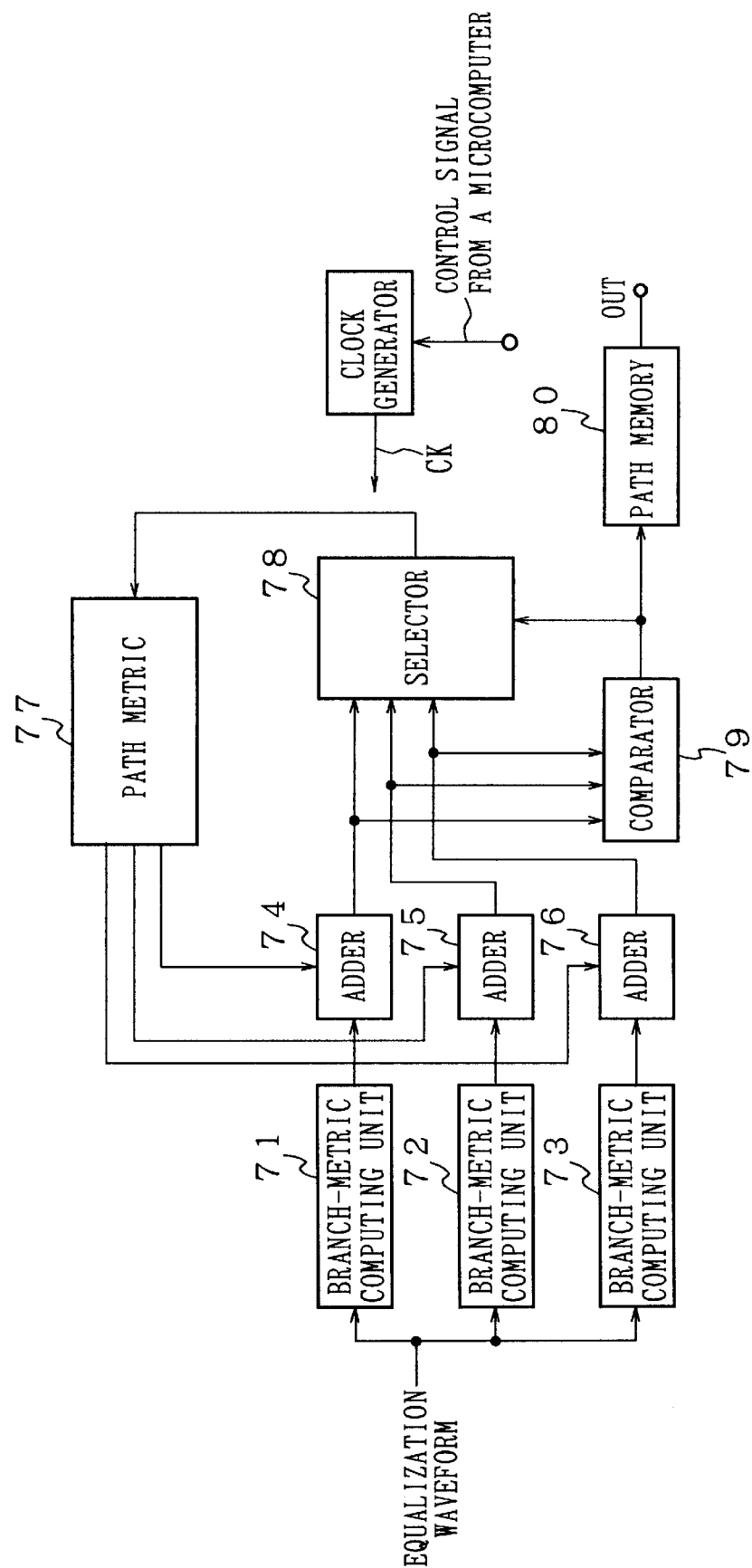
FIG. 19 is a block diagram showing a typical ACS circuit for Bitabi detection.

FIG. 19 is a diagram showing an example of the 3-input ACS circuit. As is comprehensible with ease from the figure, the 3-input ACS circuit has a configuration comprising branch-metric computing units 71 to 73, adders 74 to 76, a path metric 77, a selector 78, a comparator 79 and a path memory 80. In addition, since the operation of this circuit is the same as the ACS circuits described before, its explanation is omitted.

As described above, data is coded in accordance with encoding rules (I) and (II) and, in a decoding system, a played back waveform is subjected to $E^2PR4$ equalization prior to maximum-likelihood decoding. As a result, it is possible to realize a coding apparatus and a decoding apparatus wherein the time control is easy to execute, the number of codes that can be used (selected) in the encoder increases and the maximum inversion distance as well as the constraint length can both be shortened without reducing the coding rate.

Coding rules (I) and (II) described above are rules for an even constraint length. Examples for an odd constraint length are explained as follows.

In the case of an odd constraint length, block codes starting from a time corresponding to Q=0 and block codes starting from a time corresponding to Q=1 appear alternately and continuously. For example, codes in a block starting from Q=0 end at the last remainder Q of the block which has a value of 0. On the other hand, codes in a block starting from Q=1 end at the last remainder Q of the block which has a value of 1. These alternating blocks, assume that A is the period of the former and B is the period of the latter. In this case, a relation between the remainder Q and the codes is given as

|  | Period B | Period A | Period B |
|---|---|---|---|
| Q | ... 0 1 | 0 1 0 ... 0 1 0 | 1 0 1 ... |
| NRZI code | ... 1 1 | 1 ... 1 1 1 | 1 1 1 ... |

It should be noted that the NRZI codes shown in the above relation must be subjected to restriction.

In period A, 3 consecutively transiting consistent codes starting from Q=0 are restricted. In period B, on the other hand, 3 consecutively transiting consistent codes starting from Q=1 restricted. By doing so, in period A, 1 NRZI codes starting with 1, 1 are eliminated.
2 (NRZI codes ending with 1, 1, 1 are eliminated.)
3 NRZI codes including 1, 1, 1, 1 are eliminated.
4 NRZI codes including 1, 1, 1 starting from Q=0 are eliminated.

On the other hand, in period B,

1 NRZI codes starting with 1, 1 are eliminated.
2 (NRZI codes ending with 1, 1, 1 are eliminated.)
3 NRZI codes including 1, 1, 1, 1 are eliminated.
4 NRZI codes including 1, 1, 1 starting from Q=1 are eliminated.

That is, in the case of a train of codes having an odd constraint length of at least 3, the train of output codes is restricted so that the train does not include 3 consecutively transiting consistent codes starting with an odd-numbered code, any 4 consecutively transiting consistent codes and codes starting with 2 consecutively transiting consistent codes.

It should be noted that, by imposing these restrictions on the same bit positions within a block, entirely the same codes are eliminated without regard to whether the period is A or B. That is, it is not necessary to change procedures of coding and decoding according to the type of the period. As a result, only one transformation table of block codes provided in the encoder 13 is sufficient.

The condition enclosed in parenthesis ( ) on the list is automatically implemented by the last condition on the list for both periods A and B. Thus, in actuality, the condition enclosed in parenthesis ( ) is not required.

To put it in detail, consider for example codes with a constraint length of 9. In this case, it is possible to generate 258 codes with k=11 to give a total code count of 266. Thus, the 8/9 transformation is enabled. According to a document with a title of 'An 8/9 Rate Time-varying Trellis Code for High Density Magnetic Recording,' IEEE 1997 Digest of Intermag '97, the 8/9 transformation is actually 16/18 transformation. Thus, the 8/9 transformation is impossible. Code obtained as a result of the 8/9 transformation which is made possible by the present invention for the first time is referred to as 8/9 time-varying Trellis code.

FIGS. 20 and 21 show an example of a table for 8/9 time-varying Trellis coding that can be actually carried out.

Next, time-varying Trellis encoding with an odd constraint length at a 2's remainder is explained in concrete terms. In the $E^2PR4$ detection for this case, a configuration wherein the same path restriction is imposed on a block code boundary is required. A Trellis diagram for this restriction is shown in FIG. 22.

Figure 22:
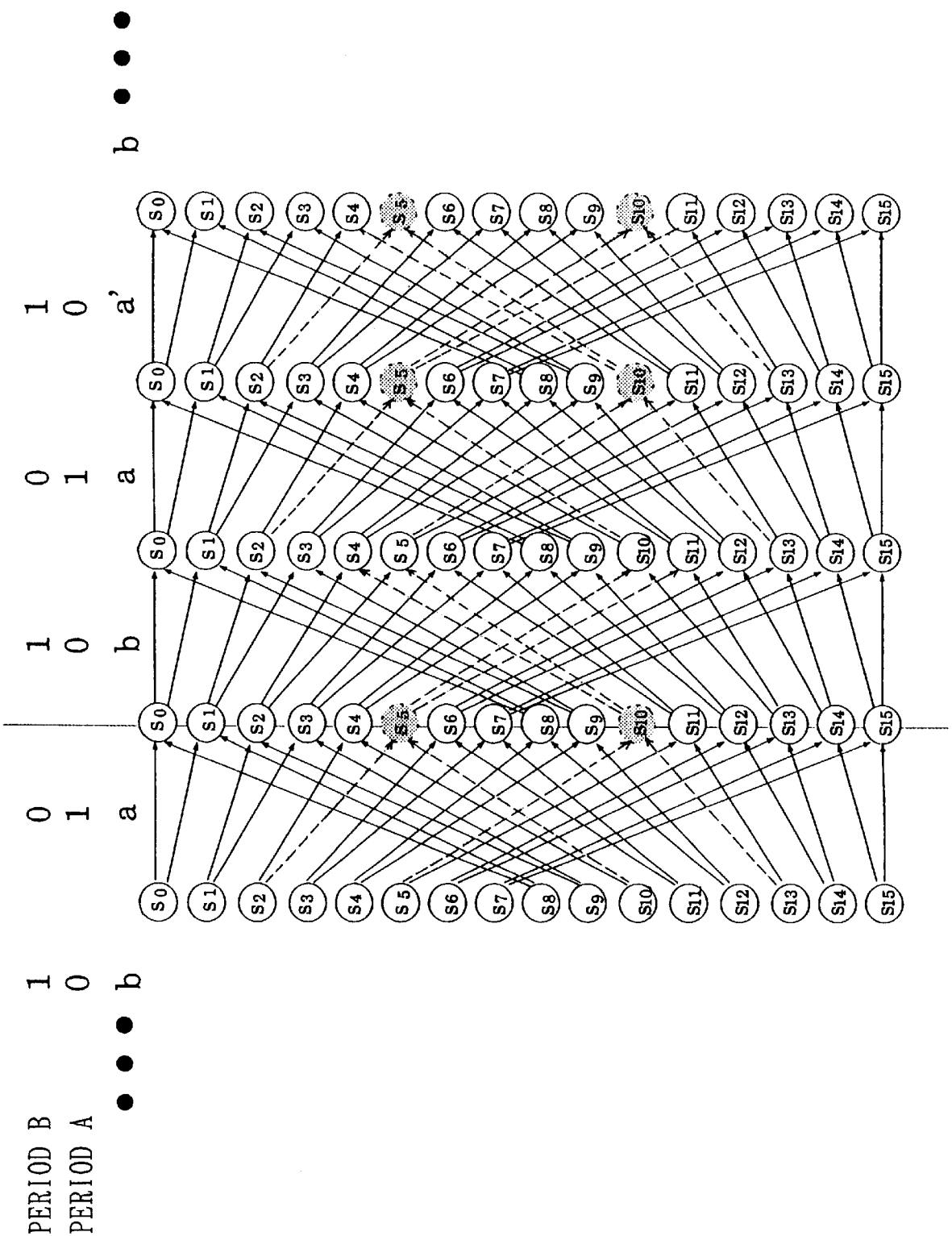
FIG. 22 is an $E^2PR4$ time-varying Trellis diagram for a case in which 2-time processing is carried out for an odd constraint length.

As shown in FIG. 22, there are 3 ways in which path restrictions are imposed, namely, a, b and a'. It should be noted that these restrictions are not dependent on the period. To put it concretely, time control processing is carried out from the beginning of a block. First of all, the time control processing starts with b, a and a'. Thereafter, since the number of times to the end is even, by repetition of b and a, time control is executed so that the last one ends with a.

As circuits for carrying out such an ACS operation, a 2-input ACS circuit shown in FIG. 13 is provided for each state. In addition, it is also obvious from FIG. 22 that all ACS operations for states $S_5$ and $S_{10}$ are not carried out while, for other states, the ordinary ACS operation is carried out.

In the case of a', all ACS operations for states $S_5$ and $S_{10}$ are not carried out either. The comparators 17 for states $S_4$ and $S_{11}$ do not compare signals. Instead, the comparators 17 each always output a signal to select the only one path connected thereto. As for other states, the ordinary ACS operation is carried out.

In the case of b, the comparators 17 for states $S_4$, $S_5$, $S_{10}$ and $S_{11}$ do not compare signals. Instead, the comparators 17 each always output a signal to select the only one path connected thereto. As for other states, the ordinary ACS operation is carried out.

In the embodiments described above, the $E^2PR4$ equalization represented by the interference polynomial $(1-D)(1+D)^3$ is implemented. It should be noted, however, that the present invention can also be applied to $E^3PR4$ equalization represented by an interference polynomial $(1-D)(1+D)^4$.

Figure 23:
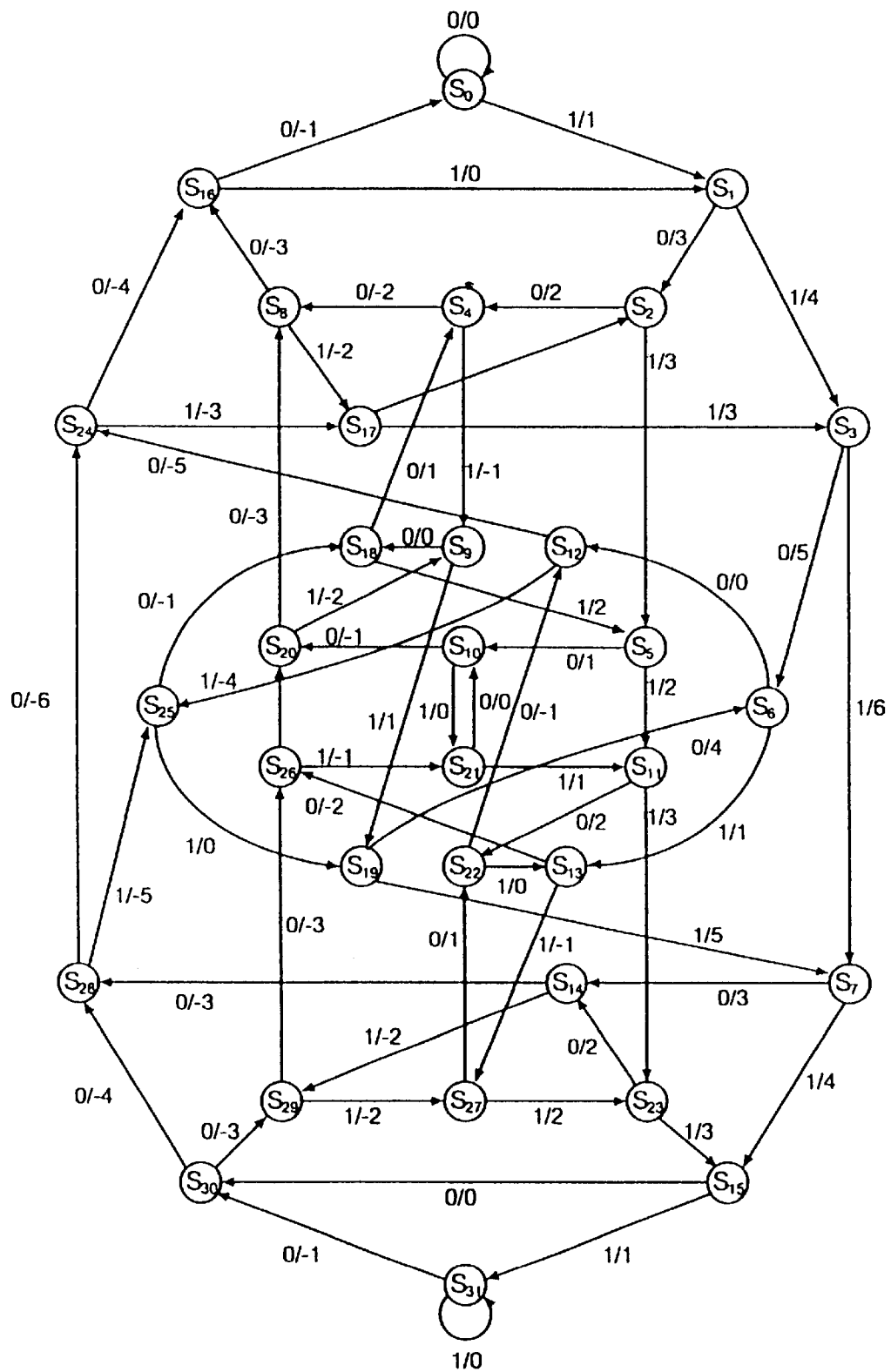
FIG. 23 is a state transition diagram of an $E^3PR4$ equalization technique.

FIG. 23 shows a state transition diagram of $E^3PR4$ equalization. As shown in the figure, each path of the state transition diagram is marked with notation (input/output).

The state-transition diagram shown in FIG. 23 is expanded along the time axis. When this Trellis diagram is timewise searched exhaustively to examine intercede distances, a characteristic is observed in a combination composing a shortest intercede distance and a second shortest intercode distance.

Here, when 4 consecutively transiting consistent codes (1, 1, 1, 1) of the NRZI code are restricted, transitions between states $S_{10}$ and $S_{21}$ in the state transition diagram shown in FIG. 23 are prohibited. If intercede distances are searched under this condition, the shortest intercede distance is found to be $\sqrt{12}$ while the second shortest intercede distance is found to be $\sqrt{28}$. That is, only the second shortest intercede distance increases from that before 4 consecutively transiting consistent codes are restricted.

There exist only 128 different patterns of codes having the shortest intercede distance obtained as a result of the restriction of 4 consecutively transiting consistent codes expressed by the NRZ representation as shown in FIGS. 24 to 27. All the patterns shown in the figures each include 3 consecutively transiting consistent codes (1, 1, 1) if a path before arriving at a state si is also taken into consideration in terms of NRZI representations. In addition, their respective combinations, that is, sequences 0 and 1, comprise elements which are adjacent to each other timewise. Such patterns also appear in a combination of second shortest intercode distances.

Thus, by eliminating codes, that is, either sequence 0 or sequence 1, from these combinations, a certain path of the Trellis diagram is restricted and, by excluding this path from paths of the Bitabi detection, the shortest intercede distance can be improved. In this embodiment, an increase in shortest intercode distance from $\sqrt{12}$ to $\sqrt{28}$ was verified.

It is obvious from the above discussion that the $E^3PR4$ time-varying Trellis code is subjected to entirely the same restriction as codes used in the $E^2PR4$ equalization. Thus, the codes described so far are applicable.

Figure 28:
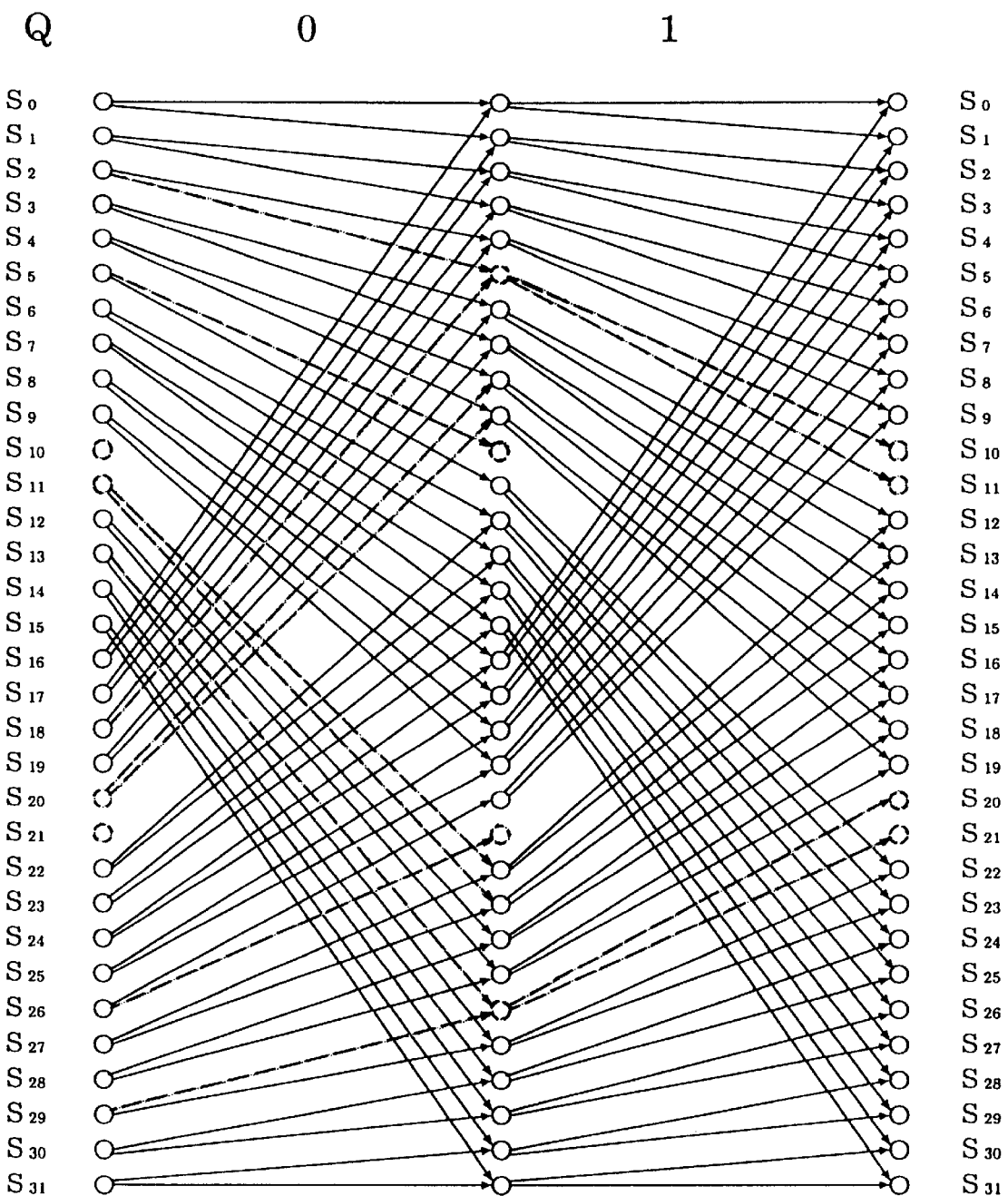
FIG. 28 is an $E^3PR4$ time-varying Trellis diagram for Q=0 and an even constraint length.

As shown in FIG. 28, the $E^3PR4$ Bitabi detector for detecting time-varying Trellis codes imposing restriction Q=0 on the 2's remainders detects codes while carrying out time control to impose restrictions on paths and states in dependence on the value of the remainder Q.

As an ACS circuit, the 2-input ACS circuit shown in FIG. 13 is used. For states other than states $S_{10}$ and $S_{21}$, this ACS circuit is also used. At a time corresponding to Q=0, all ACS operations for states $S_5$, $S_{10}$, $S_{21}$ and $S_{26}$ are not carried out. The comparators 17 for states $S_8$, $S_9$, $S_{11}$, $S_{20}$, $S_{22}$ and $S_{23}$ do not compare signals. Instead, the comparators 17 each always output a signal to select the only one path connected thereto. As for other states, the ordinary ACS operation is carried out.

At a time corresponding to Q=1, all ACS circuits for states $S_{10}$, $S_{11}$, $S_{20}$ and $S_{21}$ do not operate. As for other states, the ordinary ACS operation is carried out.

Figure 29:
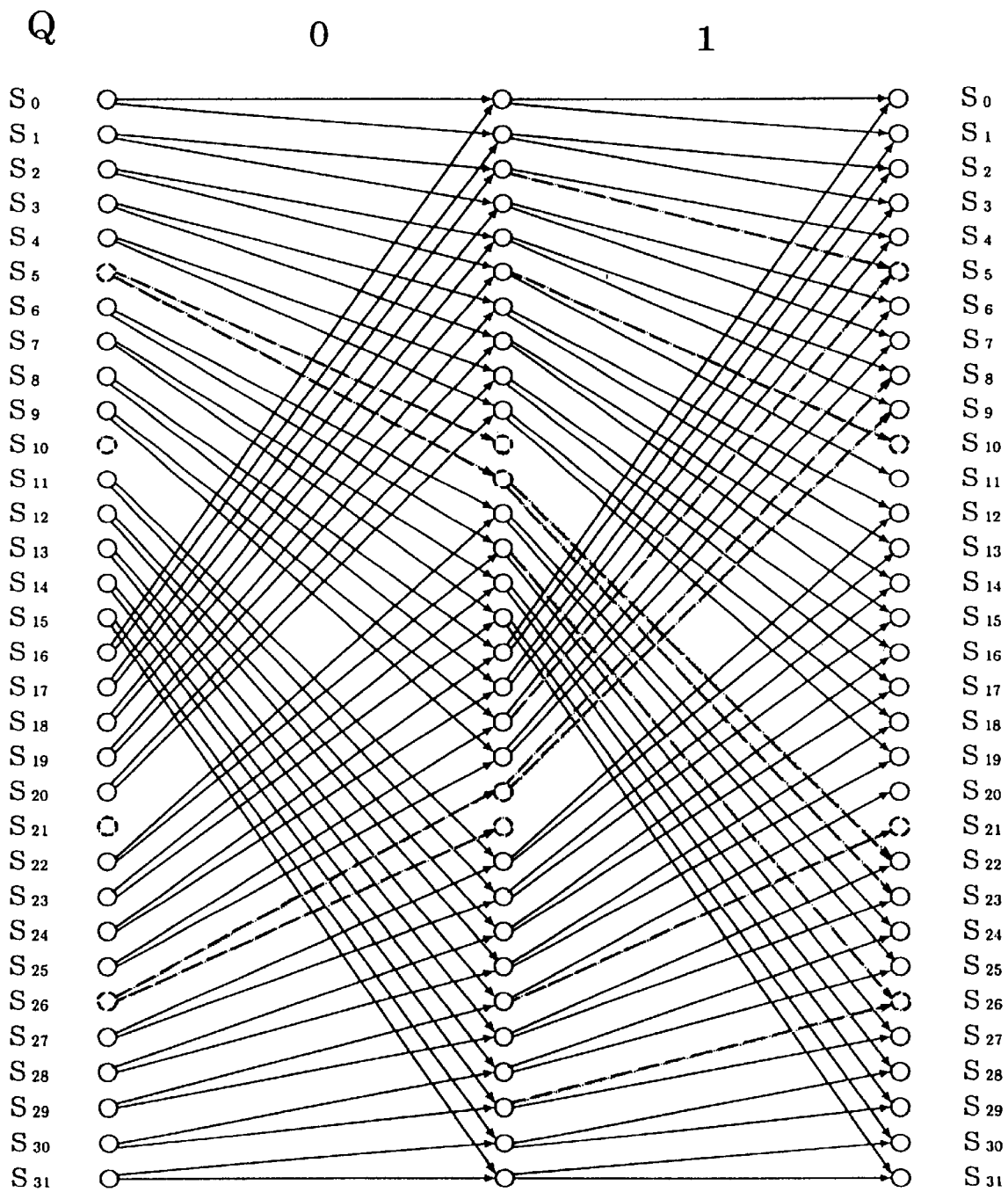
FIG. 29 is an $E^3PR4$ time-varying Trellis diagram for Q=1 and an even constraint length.

As shown in FIG. 29, the $E^3PR4$ Bitabi detector for detecting time-varying Trellis codes imposing restriction Q=1 on the 2's remainders detects codes while carrying out time control to impose restrictions on paths and states in dependence on the value of the remainder Q.

As an ACS circuit, the 2-input ACS circuit shown in FIG. 13 is used for all states.

What this ACS circuit needs to do is to carry out an ACS operation by swapping times corresponding to Q=0 and Q=1 with each other as is the case with the $E^3PR4$ Bitabi code explained earlier, that is, the time-varying Trellis codes for imposing the restriction Q=0 on the 2's remainders.

In the $E^3PR4$ Bitabi detection of the time-varying Trellis code with an odd constraint length at a 2's remainder, a configuration wherein the same path restriction is imposed on a block code boundary is required. A Trellis diagram for this restriction is shown in FIG. 30.

Figure 30:
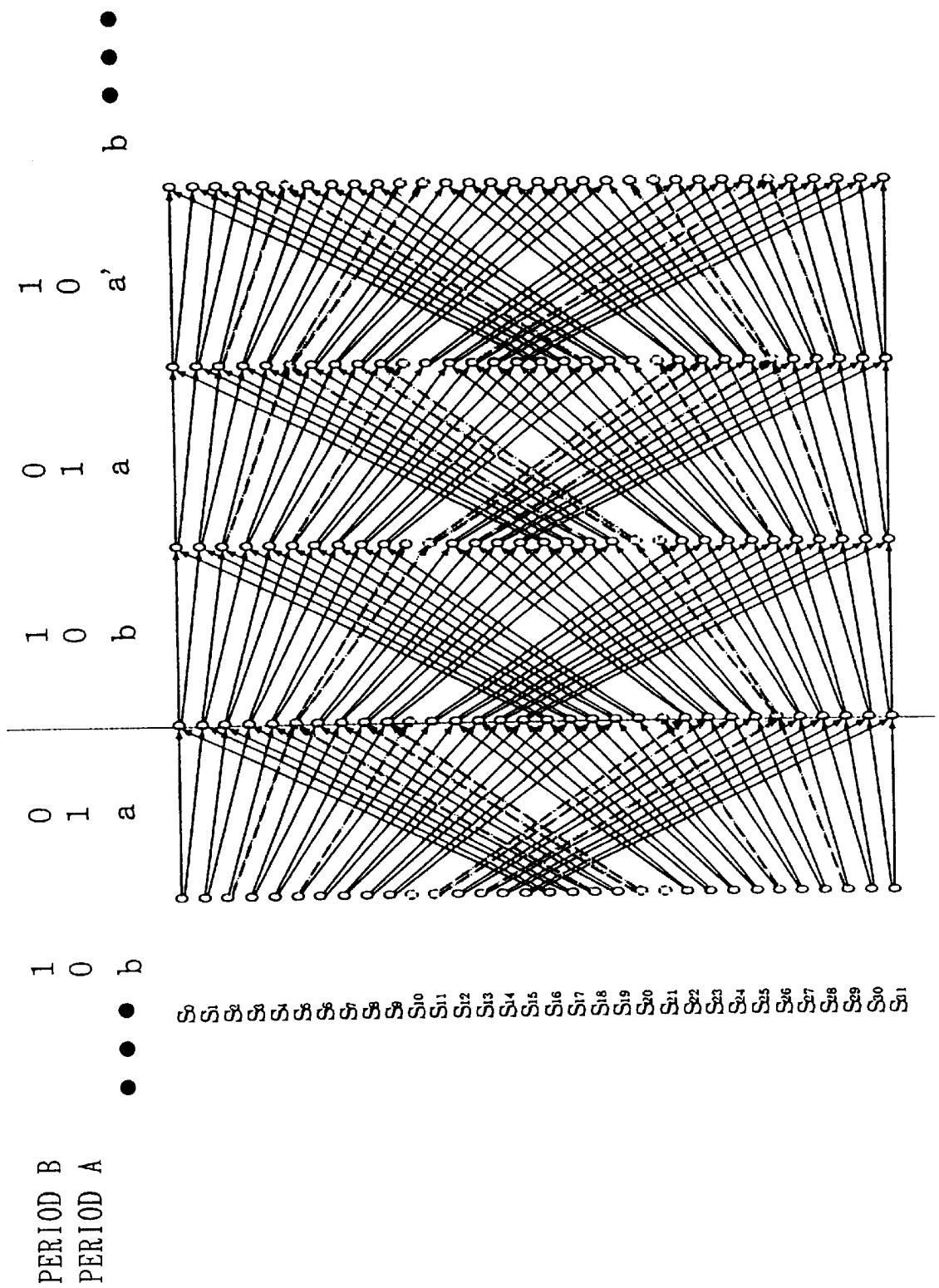
FIG. 30 is an $E^2PR4$ time-varying Trellis diagram for an odd constraint length.

As shown in FIG. 30, there are 3 ways in which path restrictions are imposed, namely, a, b and a'. It should be noted that these restrictions are not dependent on the period. To put it concretely, time control processing is carried out from the beginning of a block. First of all, the time control processing starts with b, a and a'. Thereafter, since the number of times to the end is even, by repetition of b and a, time control is executed so that the last one ends with a.

As circuits for carrying out such an ACS operation, a 2-input ACS circuit shown in FIG. 13 is provided for each state.

To explain the operation in concrete terms, in the case of a, it is obvious from FIG. 30 that all ACS operations for states $S_5$, $S_{10}$, $S_{21}$ and $S_{26}$ are not carried out while, for states $S_8$, $S_9$, $S_{11}$, $S_{20}$, $S_{22}$ and $S_{23}$, only one connected path is selected. As other states, the ordinary ACS operation is carried out.

In the case of a', all ACS operations for states $S_5$, $S_{10}$, $S_{11}$, $S_{20}$, $S_{21}$ and $S_{26}$ are not carried out. As for other states, the ordinary ACS operation is carried out.

In the case of b, all ACS operations for states $S_{10}$, $S_{11}$, $S_{20}$ and $S_{21}$ are not carried out. As for other states, the ordinary ACS operation is carried out.

Curve Lc shown in FIG. 16 is a curve for a case in which the $E^3PR4$ equalization technique is adopted as a partial-response equalization method. Thus, curve Lc is a characteristic curve for a case in which codes are restricted as is the case with the present invention.

As shown in the figure, the noise margin for curve Lc is large in comparison with curves La and Lb. It is thus obvious that effects of the improvement appear strikingly in comparison with the conventional method and the $E^2PR4$ equalization.

As described above, according to the present invention, in the case of an even constraint length, by carrying out time-varying Trellis coding whereby 3 consecutively transiting consistent codes starting from either even-numbered or odd-numbered channel clock pulse of a channel clock signal are restricted and 4 consecutively transiting consistent codes are always restricted, the shortest intercede distance can be lengthened and, at the same time, the number of codes usable in transformation can also be increased as well. In addition, the smallest inversion distance and the constraint length can be reduced to give a characteristic which makes an overwrite operation easy to perform besides shrinking of the size of the circuit including tables.

In the case of an odd constraint length, on the other hand, by carrying out coding while restricting codes so that 3 consecutively transiting consistent codes starting with an odd-numbered code, any 4 consecutively transiting consistent codes and first 2 consecutively transiting consistent codes are not included, the same effects as the even constraint length can be obtained.

Results obtained from computation of noise margins of the $E^2PR4$ and $E^3PR4$ equalization techniques against white Gaussian noise indicate that the time-varying Trellis code and the Bitabi detection for detecting the code have an intercode distance more desirable than detection other than the coding Bitabi detection.

Thus, by virtue of the present invention, it is possible to provide a coding apparatus and a decoding apparatus which are capable of avoiding an increase in circuit size, proof against noise and distortion, hence, having a low error rate, and suitable for a transmission system such as a digital recording/reproducing system.

What is claimed is:

1. A coding apparatus having an encoder for coding an input data train to produce a train of codes comprising an even number of codes as a result of restricting 3 consecutive transiting consistent codes starting at an odd-numbered or even-numbered clock pulse of a channel clock signal and restricting all 4 consecutive transiting consistent codes.

2. A coding apparatus according to claim 1 wherein said encoder is implemented by a memory means for storing a table of predetermined trains of codes or a logic circuit for outputting said predetermined trains of codes.

3. A decoding apparatus used for carrying out a process of decoding a train of codes obtained as a result of coding by restricting 3 consecutive transiting consistent codes starting at an odd-numbered or even-numbered clock pulse of a channel clock signal and restricting all 4 consecutive transiting consistent codes, said decoding apparatus having a Bitabi detector whereby, after completing partial-response equalization in said decoding process, a reproduced train of codes is subjected to maximum-likelihood decoding and Trellis path time restriction is implemented during said maximum-likelihood decoding.

4. A decoding apparatus according to claim 3 wherein $E^2PR4$ equalization or $E^3PR4$ equalization is carried out as said partial-response equalization.

5. A decoding apparatus according to claim 3 wherein $E^2PR4$ equalization or $E^3PR4$ equalization is carried out as said partial-response equalization and said Trellis path time restriction is implemented during said maximum-likelihood decoding to increase a shortest intercede distance.

6. A coding apparatus for producing a train of codes with an odd constraint length of at least 3 where said constraint length is the number of bits in said train of codes wherein said train of codes does not include 3 consecutively transiting consistent codes starting with an odd-numbered code, any 4 consecutively transiting consistent codes and codes starting with 2 consecutively transiting consistent codes.

7. A coding apparatus according to claim 6 wherein said encoder is implemented by a memory means for storing a table of predetermined trains of codes or a logic circuit for outputting said predetermined trains of codes.

8. A decoding apparatus used for carrying out a process of decoding a train of codes obtained as a result of coding carried out so that said train of codes has an odd constraint length of at least 3 where said constraint length is the number of bits in said train of codes and said train of codes does not include 3 consecutively transiting consistent codes starting with an odd-numbered code, any 4 consecutively transiting consistent codes and codes starting with 2 consecutively transiting consistent codes, said decoding apparatus having a Bitabi detector whereby, after completing partial-response equalization in said decoding process, a reproduced train of codes is subjected to maximum-likelihood decoding and Trellis path time restriction is implemented during said maximum-likelihood decoding.

9. A decoding apparatus according to claim 8 wherein $E^2PR4$ equalization or $E^3PR4$ equalization is carried out as said partial-response equalization.

10. A decoding apparatus according to claim 8 wherein $E^2PR4$ equalization or $E^3PR4$ equalization is carried out as said partial-response equalization and said Trellis path time restriction is implemented during said maximum-likelihood decoding to increase a shortest intercede distance.

11. A decoding apparatus according to claim 8 wherein said Bitabi decoder has a means for inserting a path restriction into a $3^{rd}$ cycle within said constraint length with said path restriction differing from other cycles.

* * * * *